(12) United States Patent  
Nishioka et al.

(10) Patent No.: US 9,476,949 B2  
(45) Date of Patent: Oct. 25, 2016

(54) SEMICONDUCTOR DEVICE PROVIDED WITH DIRECTION SENSOR ELEMENTS

(71) Applicant: ROHM CO., LTD., Kyoto-shi, Kyoto (JP)

(72) Inventors: Taro Nishioka, Kyoto (JP); Mamoru Yamagami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 299 days.

(21) Appl. No.: 14/450,896

(22) Filed: Aug. 4, 2014

(65) Prior Publication Data

US 2015/0035528 A1 Feb. 5, 2015

(30) Foreign Application Priority Data

Aug. 5, 2013 (JP) .................. 2013-162375  
Aug. 5, 2013 (JP) .................. 2013-162376  
May 28, 2014 (JP) .................. 2014-110172

(51) Int. Cl.
G01C 17/28 (2006.01)
G01R 33/02 (2006.01)
G01R 33/00 (2006.01)

(52) U.S. Cl.
CPC .......... *G01R 33/0206* (2013.01); *G01C 17/28* (2013.01); *G01R 33/0005* (2013.01); *H01L 2224/48091* (2013.01); *H01L 2224/48137* (2013.01); *H01L 2224/48465* (2013.01); *H01L 2224/48471* (2013.01); *H01L 2224/48479* (2013.01); *H01L 2224/73265* (2013.01)

(58) Field of Classification Search
CPC ...... H01L 25/041; H01L 27/17; H01L 31/12
USPC ...................................... 33/355 R
See application file for complete search history.

(56) References Cited

U.S. PATENT DOCUMENTS

| | | | | |
|---|---|---|---|---|
| 3,965,568 A | * | 6/1976 | Gooch | H01L 21/78 257/457 |
| 7,119,533 B2 | * | 10/2006 | Tamura | G01C 17/38 324/202 |
| 7,870,678 B2 | * | 1/2011 | Kwon | G01C 17/28 33/355 R |
| 8,455,962 B2 | | 6/2013 | Honkura et al. | |
| 2004/0036078 A1 | * | 2/2004 | Kondo | H01L 21/6835 257/80 |
| 2007/0033818 A1 | * | 2/2007 | Kitamura | G01C 17/38 33/355 R |
| 2014/0082952 A1 | * | 3/2014 | Fujiwara | G01P 13/00 33/355 R |
| 2015/0084200 A1 | * | 3/2015 | Cok | G02B 6/138 257/773 |
| 2016/0007464 A1 | * | 1/2016 | Matsubara | H05K 1/181 361/783 |
| 2016/0033658 A1 | * | 2/2016 | Saveliev | H01L 25/042 250/370.01 |
| 2016/0141440 A1 | * | 5/2016 | Chun | H01L 31/18 257/82 |

FOREIGN PATENT DOCUMENTS

JP 2009-300093 12/2009

* cited by examiner

*Primary Examiner* — G. Bradley Bennett  
(74) *Attorney, Agent, or Firm* — Hamre, Schumann, Mueller & Larson, P.C.

(57) ABSTRACT

A semiconductor device is provided with a substrate including a main surface and a back surface that face in opposite directions to each other in a thickness direction, and first, second and third direction sensor elements having different detection reference axes from each other. The substrate is formed with a recessed portion that is recessed from the main surface toward the back surface side. The first direction sensor element is disposed at least partially within the recessed portion. The second direction sensor element is disposed so as to overlap with the main surface as viewed in the thickness direction.

31 Claims, 25 Drawing Sheets

SEMICONDUCTOR DEVICE PROVIDED WITH DIRECTION SENSOR ELEMENTS

BACKGROUND OF THE INVENTION

1. Field of the Invention

The present invention relates to a semiconductor device provided with a plurality of direction sensor elements.

2. Description of Related Art

Heretofore, semiconductor devices (magnetic sensors) that detect orientation in three-dimensional space by utilizing geomagnetism have been proposed. For example, JP-A-2009-300093 discloses a semiconductor device that is provided with three direction sensor elements. Each direction sensor element has a magnetic core constituting a predetermined detection reference axis. The three direction sensor elements are installed on a substrate, such that the respective detection reference axes extend in different directions to each other.

Generally, in the case of a magnetic sensor having three direction sensor elements, one of the sensor elements is disposed such that the detection reference axis thereof is parallel to a thickness direction of the substrate. For this reason, the size of a conventional magnetic sensor in the thickness direction is necessarily greater than the sum of the thickness of the substrate and the length of the direction sensor elements, and thus there is room for improvement in terms of miniaturization.

SUMMARY OF THE INVENTION

The present invention has been proposed under the above circumstances. In view of this, it is an object of the present invention to provide a semiconductor device with respect to which miniaturization can be achieved.

A semiconductor device according to one aspect of the present invention is provided with a substrate having a main surface and a back surface that face in opposite directions to each other in a thickness direction, and first, second and third direction sensor elements having different detection reference axes from each other. The substrate is formed with a recessed portion that is recessed from the main surface toward the back surface side. The first direction sensor element is disposed at least partially within the recessed portion. The second direction sensor element is disposed so as to overlap with the main surface as viewed in the thickness direction.

In one embodiment of the present invention, the third direction sensor element is disposed so as to overlap with the main surface as viewed in the thickness direction.

In one embodiment of the present invention, the detection reference axis of the first direction sensor element extends in the thickness direction.

In one embodiment of the present invention, the detection reference axis of the second direction sensor element is parallel to the main surface. Also, the detection reference axis of the third direction sensor element is parallel to the main surface.

In one embodiment of the present invention, the detection reference axes of the first, second and third direction sensor elements are at right angles to each other.

In one embodiment of the present invention, the semiconductor device is further provided with an integrated circuit element that is interposed between the main surface and the second direction sensor element.

In one embodiment of the present invention, part of the first direction sensor element projects from the main surface of the substrate in the thickness direction.

In one embodiment of the present invention, the recessed portion includes a bottom surface that is located between the main surface and the back surface in the thickness direction, and the first direction sensor element is supported by the bottom surface.

In one embodiment of the present invention, the substrate includes a base material that constitutes the main surface and the back surface and that includes a wiring pattern formed therein.

In one embodiment of the present invention, the wiring pattern includes an intermediate layer that is located between the main surface and the back surface in the thickness direction, and the intermediate layer includes a blocking portion that constitutes the bottom surface of the recessed portion.

In one embodiment of the present invention, the blocking portion is larger than the bottom surface as viewed in the thickness direction.

In one embodiment of the present invention, the wiring pattern includes a plurality of back surface electrodes that are exposed at the back surface.

In one embodiment of the present invention, the blocking portion and the plurality of back surface electrodes are insulated from each other.

In one embodiment of the present invention, the blocking portion is exposed at the back surface.

In one embodiment of the present invention, the semiconductor device is further provided with a resin sealing portion that covers the first direction sensor element, the second direction sensor element and the third direction sensor element. Part of this resin sealing portion fills the recessed portion.

In one embodiment of the present invention, the substrate includes a lateral surface connecting the main surface and the back surface, and the resin sealing portion includes a lateral surface that is flush with the lateral surface of the substrate.

Other features and advantages of the present invention will be more fully understood from the following detailed description, taken in conjunction with the accompanying drawings.

DETAILED DESCRIPTION OF THE PREFERRED EMBODIMENTS

Figure 1:
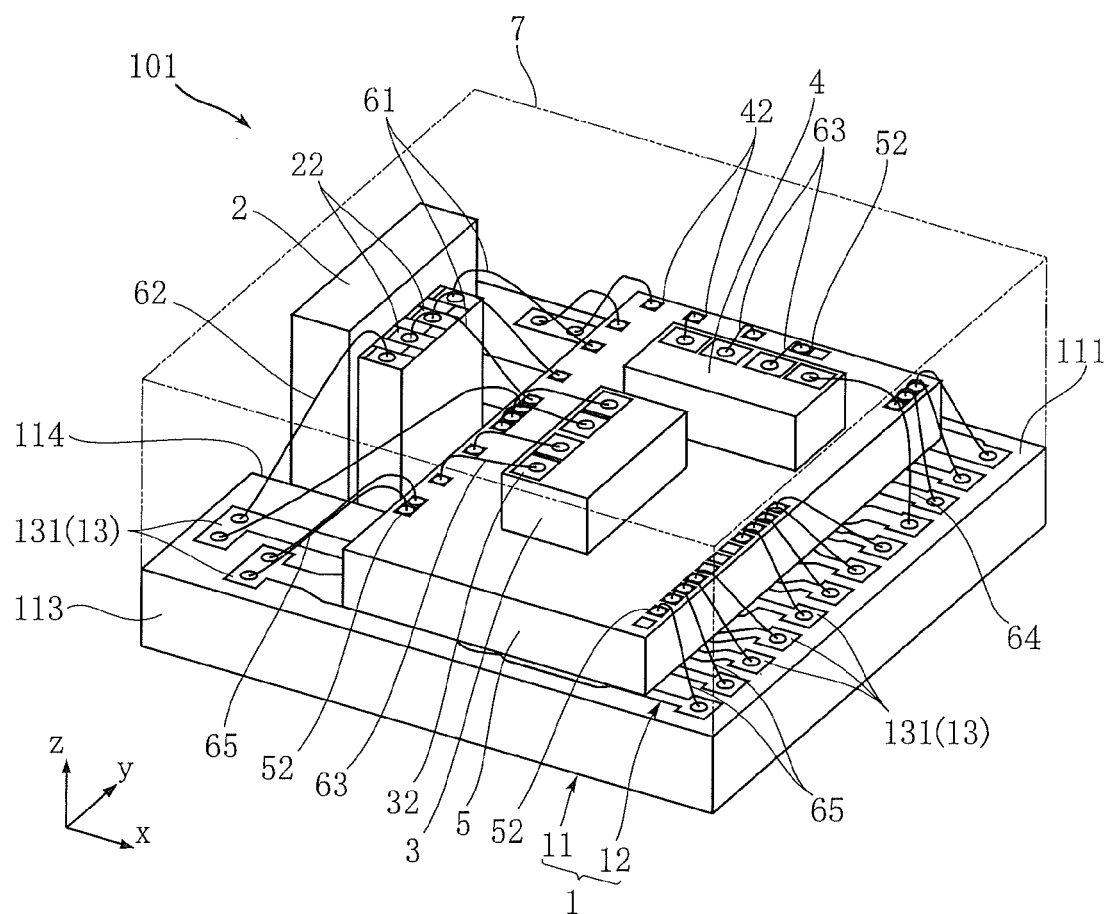
FIG. 1 is a perspective view showing the semiconductor device that is based on a first embodiment of the present invention.

Hereinafter, embodiments of the present invention will be described in detail with reference to the drawings.

FIGS. 1 to 7 show a semiconductor device 101 that is based on the first embodiment of the present invention. The semiconductor device 101 is provided with a substrate 1, a first direction sensor element 2, a second direction sensor element 3, a third direction sensor element 4, an integrated circuit element 5, a plurality of first wires 61, a second wire 62, a plurality of third wires 63, a fourth wire 64, a plurality of fifth wires 65, and a resin sealing portion 7. The semiconductor device 101 is configured to detect the orientation of the same semiconductor device in three-dimensional space utilizing geomagnetism. The detection result is output from the semiconductor device 101 as an electrical signal. In this embodiment, the semiconductor device 101 is a rectangular parallelepiped, and has, for example, a size of about 2.0 mm in an x direction, about 2.0 mm in a y direction, and about 0.8 mm in a z direction.

Figure 2:
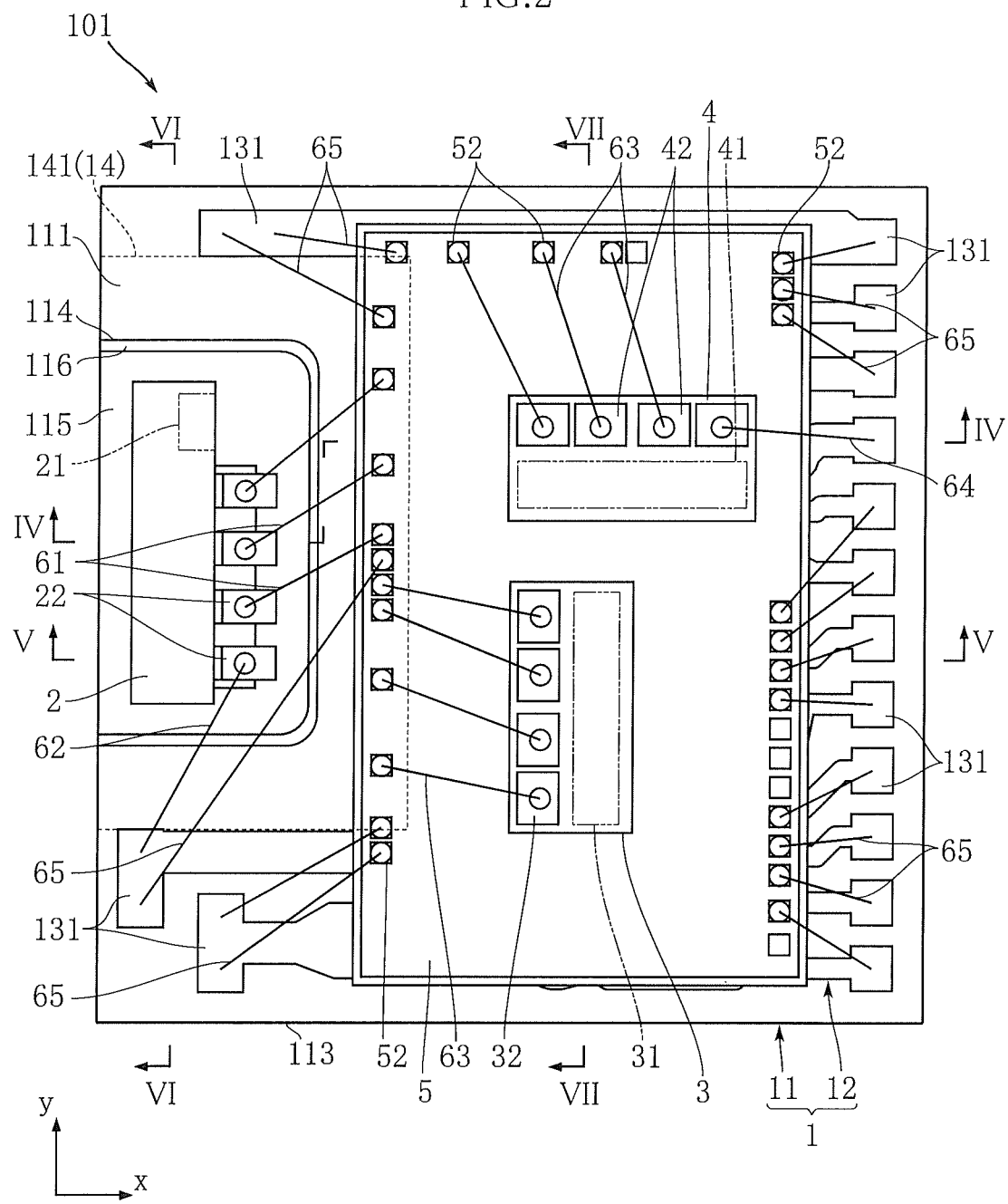
FIG. 2 is a plan view showing the semiconductor device.

FIG. 1 is a perspective view showing the semiconductor device 101. FIG. 2 is a plan view showing the semiconductor device 101. In FIG. 1, the resin sealing portion 7 is shown with a two dot chain line, whereas the resin sealing portion 7 is omitted in FIG. 2.

The substrate 1 supports the first direction sensor element 2, the second direction sensor element 3, the third direction sensor element 4, and the integrated circuit element 5. In this embodiment, the substrate 1 is equipped with a base material 11 and a wiring pattern 12. The substrate 1 has a main surface 111, a back surface 112, a lateral surface 113, and a recessed portion 114. In the present embodiment, the substrate 1 is rectangular, and the lateral surface 113 consists of four flat surfaces. The substrate 1 has, for example, a size of about 2.0 mm in the x and y directions, and about 0.23 mm in the z direction.

The main surface 111 and the back surface 112 face in opposite directions to each other in a thickness direction (z direction) of the substrate 1. The lateral surface 113 is a surface connecting the main surface ill and the back surface 112, and is parallel to the z direction in the present embodiment.

The recessed portion 114 is a portion recessed from the main surface 111 toward the back surface 112 side. In FIG. 2, the recessed portion 114 is formed in the left edge of the substrate 1, and is only open to the left. That is, the recessed portion 114 is closed to the right and in the y direction (upward and downward directions in FIG. 2). In other words, one opening that communicates with the recessed portion 114 is formed in the lateral surface 113 of the substrate 1. The recessed portion 114 is approximately rectangular as viewed in the z direction, and has, for example, a size of about 0.5 mm in the x direction, about 1.0 mm in the y direction, and about 0.15 mm in the z direction (depth).

FIGS. 8 to 11 show the substrate 1 that is used in the semiconductor device 101. As shown in these diagrams, the recessed portion 114 has a bottom surface 115, an inner surface 116, and a curved surface 117. The bottom surface 115 is located between the main surface 111 and the back surface 112 in the z direction, and faces upward in the z direction. In the present embodiment, the bottom surface 115 is a smooth surface. The inner surface 116 is connected to the main surface 111. In the present embodiment, the inner surface 116 has a shape consisting of three sides that are mutually connected, as viewed in the z direction (see FIG. 9). More specifically, the inner surface 116 has a shape consisting of two parallel sides separated in the y direction, and one side connected to one end (right end in FIG. 9) of the two parallel sides. In the present embodiment, the inner surface 116 slopes in the z direction so as to become further distant from the center of the bottom surface 115 upwardly in the z direction. The curved surface 117 connects the inner surface 116 and the bottom surface 115, and curves concavely.

The base material 11 is made of an insulating material (e.g., glass epoxy resin). The wiring pattern 12 is made of a metal. The wiring pattern 12 may be a structure in which a plurality of layers made of different metals such as Cu, Ni and Au, for example, are laminated. The wiring pattern 12 has a main surface layer 13, a plurality of intermediate layers 14, and a plurality of back surface electrodes 15. In the present embodiment, the substrate 1 is a multilayer substrate including the base material 11, the main surface layer 13, the intermediate layers 14, and the back surface electrodes 15.

Figure 9:
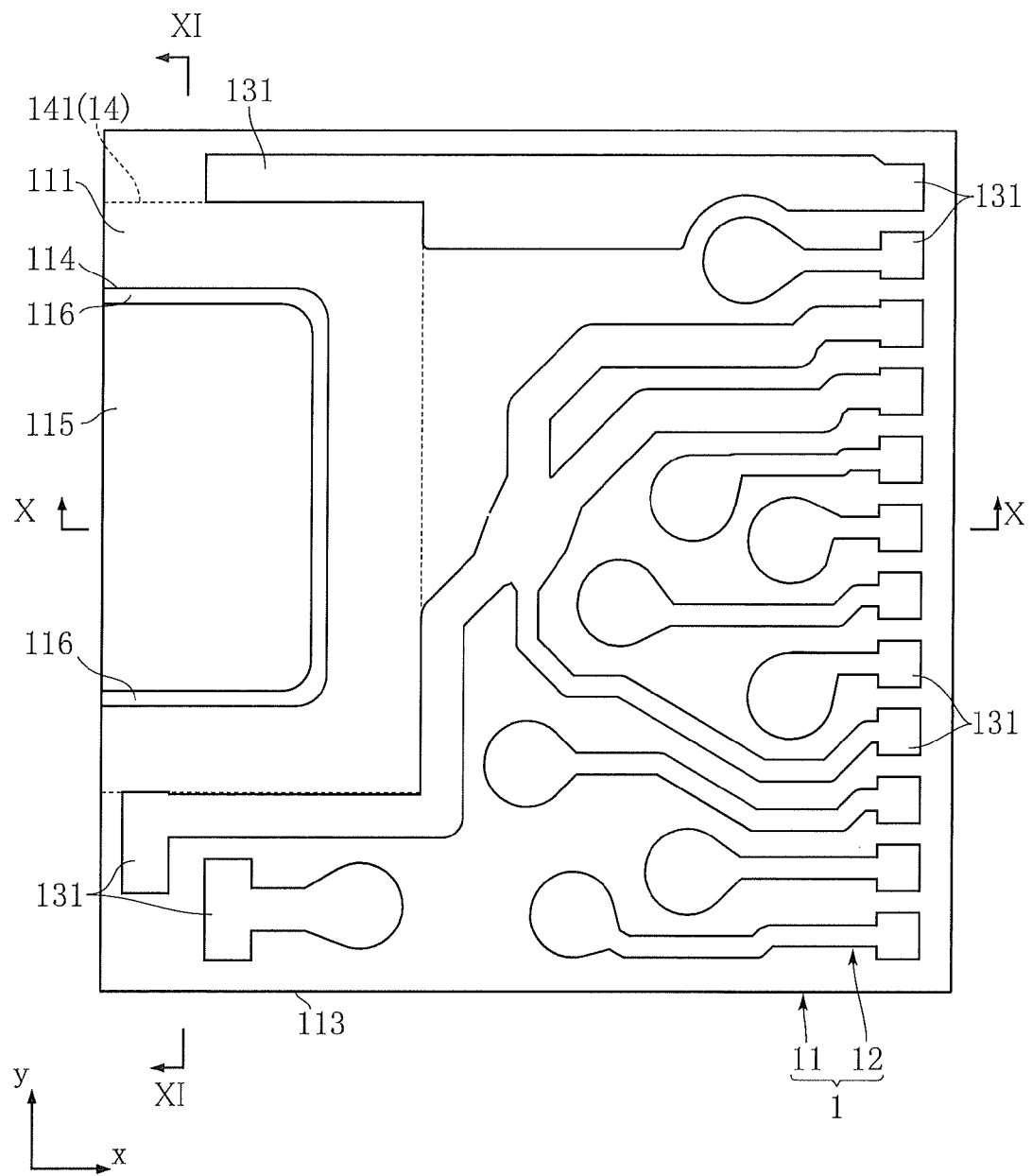
FIG. 9 is a plan view showing the substrate.
Figure 10:
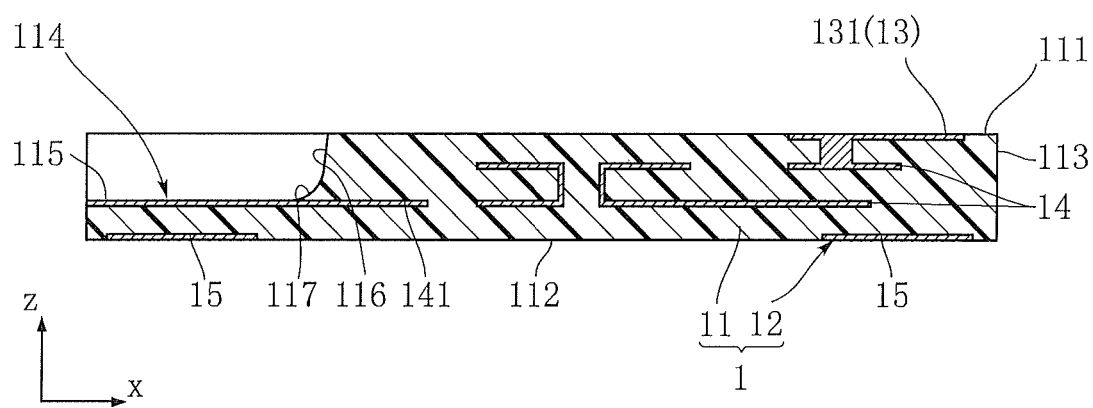
FIG. 10 is a cross-sectional view along an X-X line in FIG. 9.
Figure 11:
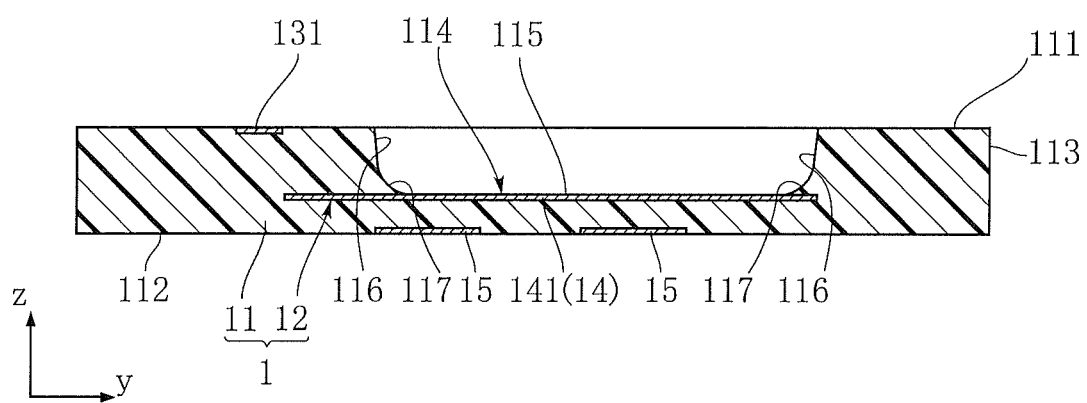
FIG. 11 is a cross-sectional view along an XI-XI line in FIG. 9.

The main surface layer 13 is, as shown in FIG. 10, embedded in the base material 11, except for the upper surface. The upper surface of the main surface layer 13 is exposed to the outside at the main surface 111. The main surface layer 13 has a plurality of pads 131. Band-like portions forming conduction paths extend from the plurality of pads 131. As shown in FIG. 9, in the present embodiment, the plurality of pads 131 include pads disposed in proximity to the right side of the base material 11, pads disposed in proximity to the top left corner of the base material 11, and pads disposed in proximity to the bottom left corner of the base material 11.

The intermediate layers 14 are layers provided inside the base material 11. In the present embodiment, there are two intermediate layers 14 (upper intermediate layer and lower intermediate layer) that are separated in the z direction. These intermediate layers 14 conduct to the main surface layer 13 and the plurality of back surface electrodes 15 as appropriate via through hole electrodes (or via electrodes). In the present embodiment, each through hole electrode extends through part of the base material 11 in the z direction.

The lower intermediate layers 14 has a blocking portion 141. The blocking portion 141 is larger than the recessed portion 114 as viewed in the z direction, and overlaps with the entire recessed portion 114. The bottom surface 115 of the recessed portion 114 is constituted by the upper surface of the blocking portion 141. In the present embodiment, the blocking portion 141 is rectangular. The blocking portion 141 is electrically insulated from other sites of the wiring pattern 12.

Figure 3:
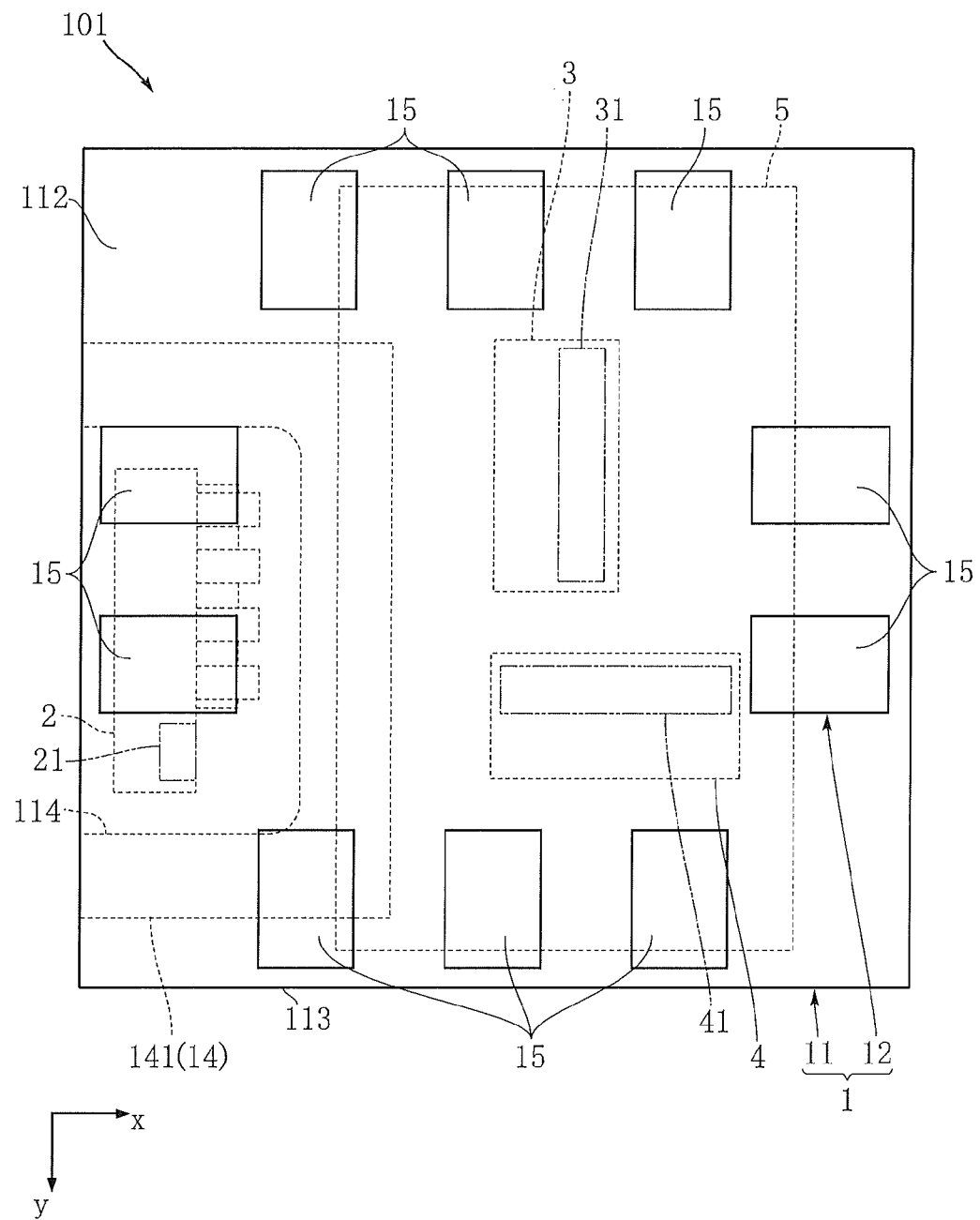
FIG. 3 is a bottom plan view showing the semiconductor device.

Each of the plurality of back surface electrodes 15 is embedded in the base material 11 such that the lower surface is exposed to the outside at the back surface 112. When the semiconductor device 101 is mounted on a circuit board, for example, the plurality of back surface electrodes 15 are used in order to establish electrical continuity with the circuit board. As shown in FIG. 3, in the present embodiment, eight back surface electrodes 15 are disposed along the four sides of the base material 11. The two back surface electrodes 15 that are located on the left overlap with the blocking portion 141 of the wiring pattern 12 as viewed in the z direction, and are located below the blocking portion 141 (see FIGS. 4 and 5).

Next, a method for manufacturing the substrate 1 will be described, with reference to FIGS. 12 and 13.

Figure 12:
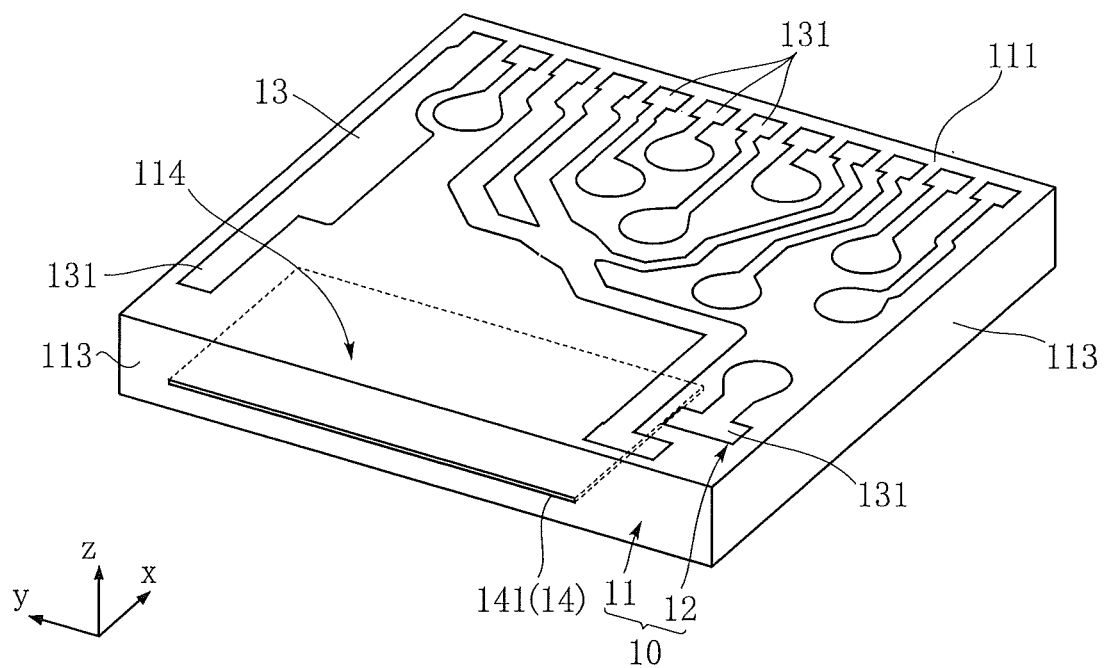
FIG. 12 is a perspective view showing material that is used in manufacturing the substrate.

FIG. 12 is a perspective view showing a substrate material 10 used in manufacturing the substrate 1. The substrate material 10 has the base material 11 and the wiring pattern 12. At this stage, the base material 11 has uniform thickness, since the recessed portion 114 has not been formed. The blocking portion 141 of the wiring pattern 12 is disposed within the base material 11, and the upper surface thereof is covered by the base material 11. Note that although, in the example shown in the diagram, the substrate material 10 is substantially the same size as the substrate 1, the present invention is not intended to be limited thereto. For example, a substrate material that is larger than the substrate 1 may be used. A configuration may be adopted in which the size of the blocking portion 141 is adjusted as appropriate (e.g., to increase the size in the x direction), according to the size of the substrate material.

Figure 13:
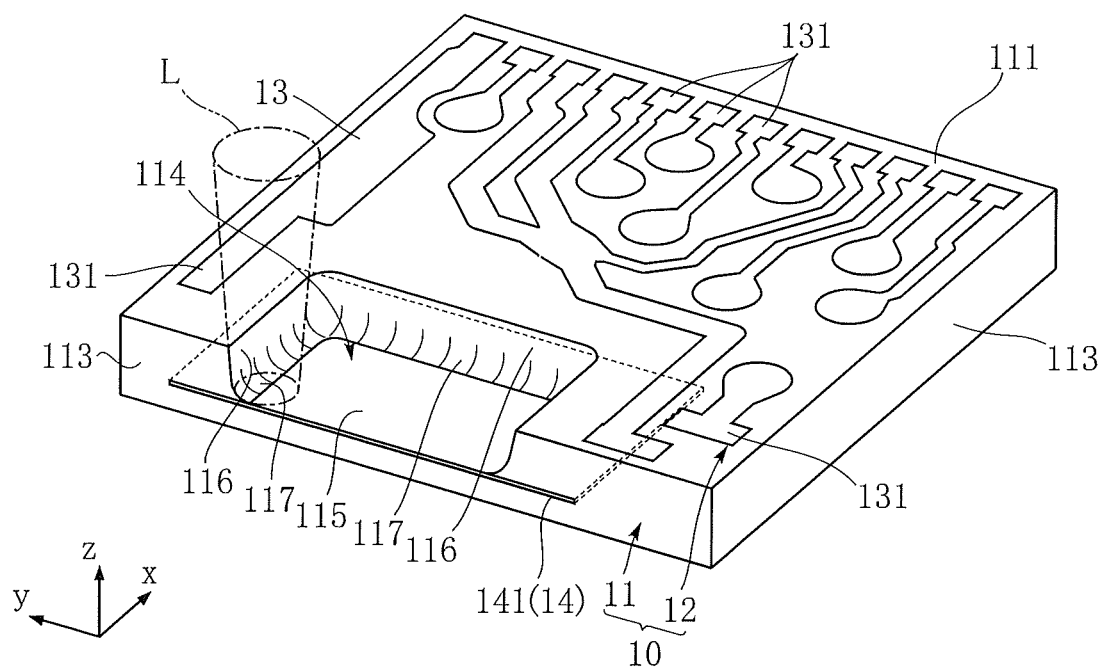
FIG. 13 is a perspective view showing one process of a method for manufacturing the substrate.

Subsequently, as shown in FIG. 13, the base material 11 is irradiated with a laser light L from above the main surface 111. This laser light L is light of a wavelength that is absorbed by the base material 11. The site of the base material 11 that is irradiated with the laser light L heats up and is removed. The site that is irradiated with the laser light L overlaps with the blocking portion 141, and is a region smaller in area than the blocking portion 141. The blocking portion 141 is made of a metal that reflects the laser light L. For example, in the case where a YAG laser is used, exemplary materials of the blocking portion 141 include Cu. Part of the base material 11 is removed by the laser light L, and the blocking portion 141 is exposed. The recessed portion 114 is thereby formed. The upper surface of the blocking portion 141 becomes the bottom surface 115 of the recessed portion 114.

The laser light L is collected onto the base material 11 by an optical system (illustration omitted). The laser light L thus forms a conical shape (or a truncated conical shape) that tapers downward. The inner surface 116 that slopes in the z direction is thereby formed in the recessed portion 114. Also, the curved surface 117 is formed between the inner surface 116 and the bottom surface 115.

The integrated circuit element 5 controls direction detection processing that uses the first direction sensor element 2, the second direction sensor element 3, and the third direction sensor element 4. In the present embodiment, the integrated circuit element 5 is constituted as a so-called ASIC (Application Specific Integrated Circuit) element, and the thickness thereof is about 80 to 100 µm.

The integrated circuit element 5 is joined to the main surface 111 by a joining material 53. The integrated circuit element 5 overlaps entirely with the main surface 111 as viewed in the z direction, but does not overlap with the recessed portion 114.

A plurality of pads 52 are formed on the upper surface of the integrated circuit element 5. In the present embodiment, the plurality of pads 52 are arrayed along three sides of the integrated circuit element 5 as viewed in the z direction. Each pad 52 has a surface made of Au, for example.

The first direction sensor element 2, the second direction sensor element 3 and the third direction sensor element 4 have detection reference axes in different directions to each other, and are used in order to detect the orientation of the semiconductor device 101 relative to geomagnetism. In the present embodiment, the first direction sensor element 2 has a magnetic core 21, the second direction sensor element 3 has a magnetic core 31, and the third direction sensor element 4 has a magnetic core 41. The magnetic core 21, the magnetic core 31 and the magnetic core 41 are metal rod-like members extending in predetermined directions. The longitudinal direction of each rod-like member is equivalent to the direction of the detection reference axis of the corresponding sensor element. Also, each sensor element has a coil (illustration omitted) formed so as to surround the magnetic core. The length (size measured in the longitudinal direction) of the axial center of each sensor element is about 0.6 mm, for example.

The first direction sensor element 2 is joined to the bottom surface 115 of the blocking portion 141 by a joining material 23. The first direction sensor element 2 is installed so as to be oriented with the magnetic core 21 parallel to the z direction. A lower portion of the first direction sensor element 2 thus overlaps with the recessed portion 114 in the z direction (i.e., is located within the recessed portion 114). An upper portion of the first direction sensor element 2 projects upward from the recessed portion 114. Four pads 22 are formed on the first direction sensor element 2. The four pads 22 are disposed slightly lower than the upper end of the first direction sensor element 2 (see FIG. 1). Each pad 22 faces upward, and has a surface made of Au, for example.

The second direction sensor element 3 is joined to the upper surface of the integrated circuit element 5 by a joining material 33. The magnetic core 31 of the second direction sensor element 3 is parallel to the y direction. The second direction sensor element 3 overlaps entirely with the integrated circuit element 5 as viewed in the z direction. Four pads 32 are formed on the second direction sensor element 3. The four pads 32 are disposed in a row in the y direction, and face upward in the z direction. Each pad 32 has a surface made of Au, for example.

The third direction sensor element 4 is joined to the upper surface of the integrated circuit element 5 by a joining material 43. The magnetic core 41 of the third direction sensor element 4 is parallel to the x direction. The third direction sensor element 4 overlaps entirely with the integrated circuit element 5 as viewed in the z direction. Four pads 42 are formed on the third direction sensor element 4. The four pads 42 are disposed in a row in the x direction, and face upward in the z direction. Each pad 42 has a surface made of Au, for example.

Figure 4:
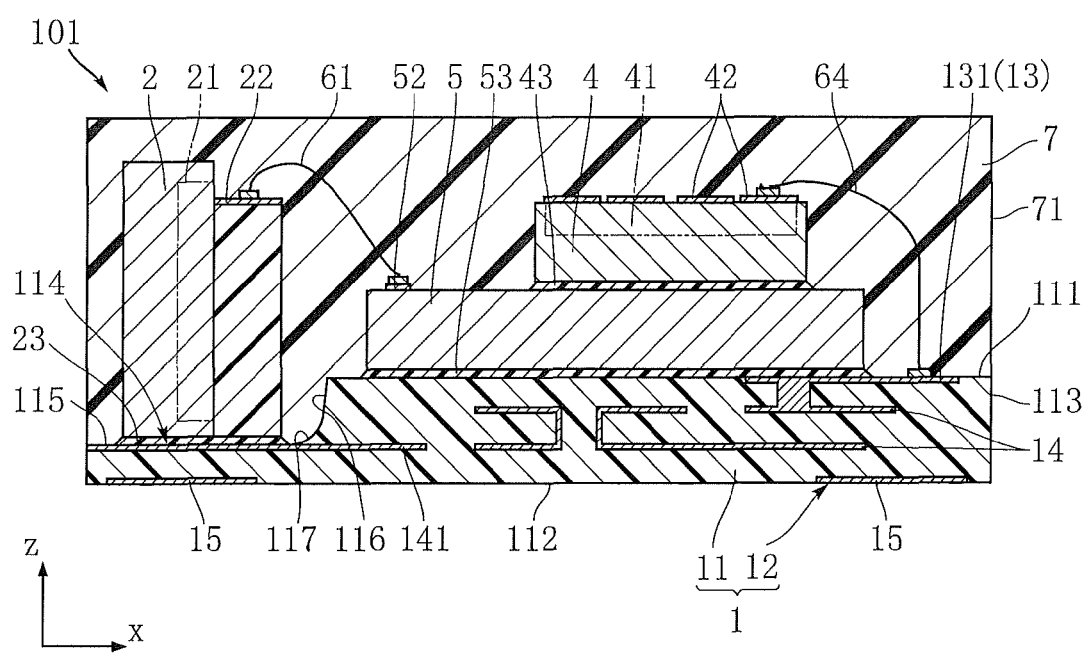
FIG. 4 is a cross-sectional view along an IV-IV line in FIG. 2.

Each of the plurality of first wires 61 connects one pad 22 of the first direction sensor element 2 to one pad 52 of the integrated circuit element 5, and is made of Au, for example. As shown in FIG. 4, a first bonding portion of the first wires 61 is connected to the pads 22 of the first direction sensor element 2. Also, a second bonding portion of the first wires 61 is connected to the pads 52 of the integrated circuit element 5 via a bump. The bumps are formed by melting the tip of a wire made of Au, and adhering this molten ball to the pad 52 (the same applied to bumps that are mentioned below).

The second wire 62 connects one pad 22 of the first direction sensor element 2 to one pad 131 of the substrate 1, and is made of Au, for example. A first bonding portion of the second wire 62 is connected to the pad 22 of the first direction sensor element 2. Also, a second bonding portion of the second wire 62 is connected directly to the pad 131 of the substrate 1. That is, there is no bump between the second bonding portion of the second wire 62 and the pad 131.

Figure 5:
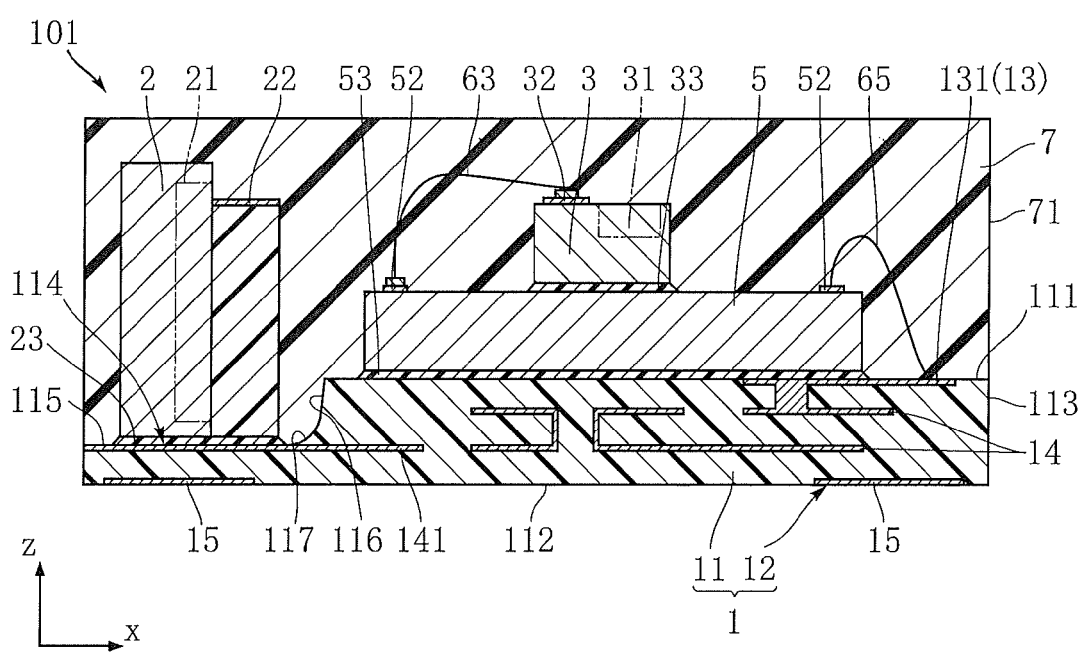
FIG. 5 is a cross-sectional view along a V-V line in FIG. 2.
Figure 6:
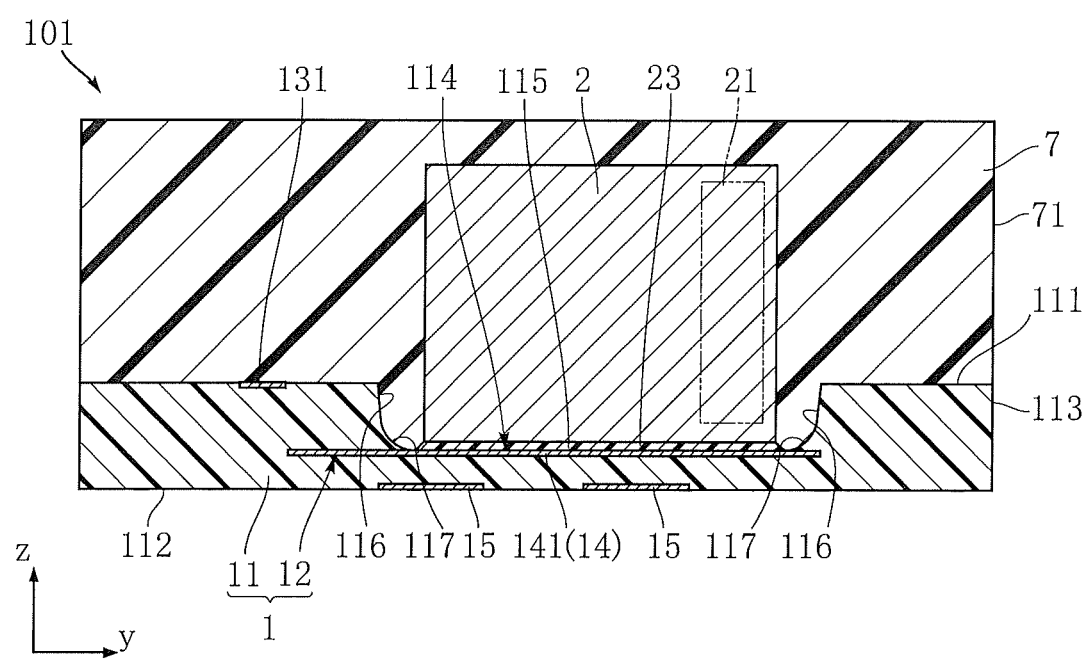
FIG. 6 is a cross-sectional view along a VI-VI line in FIG. 2.
Figure 7:
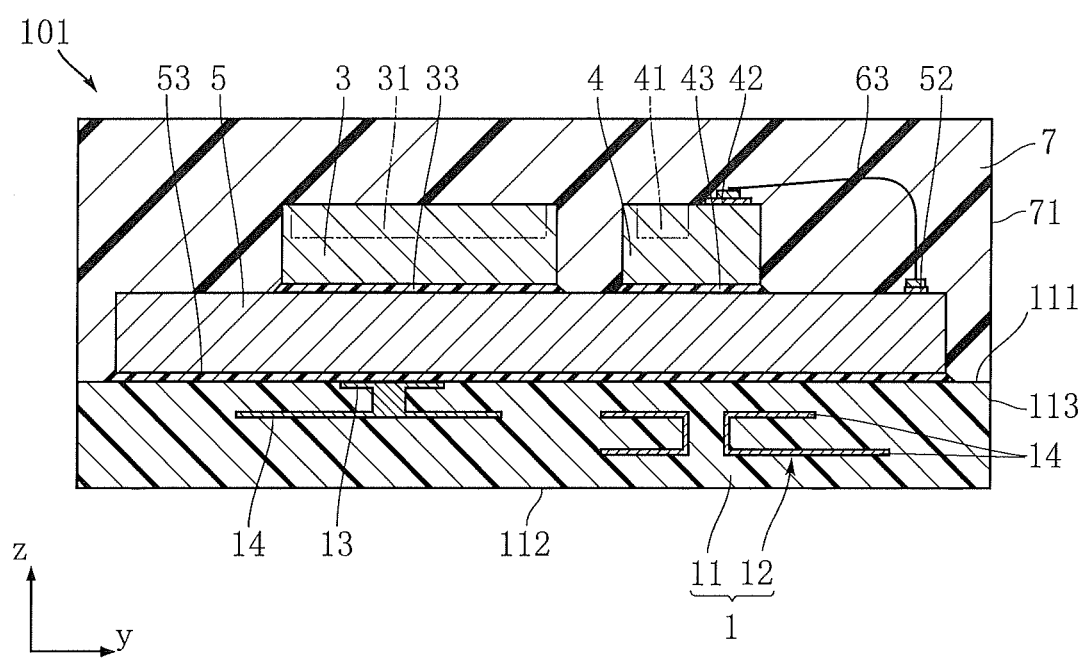
FIG. 7 is a cross-sectional view along a VII-VII line in FIG. 2.
Figure 8:
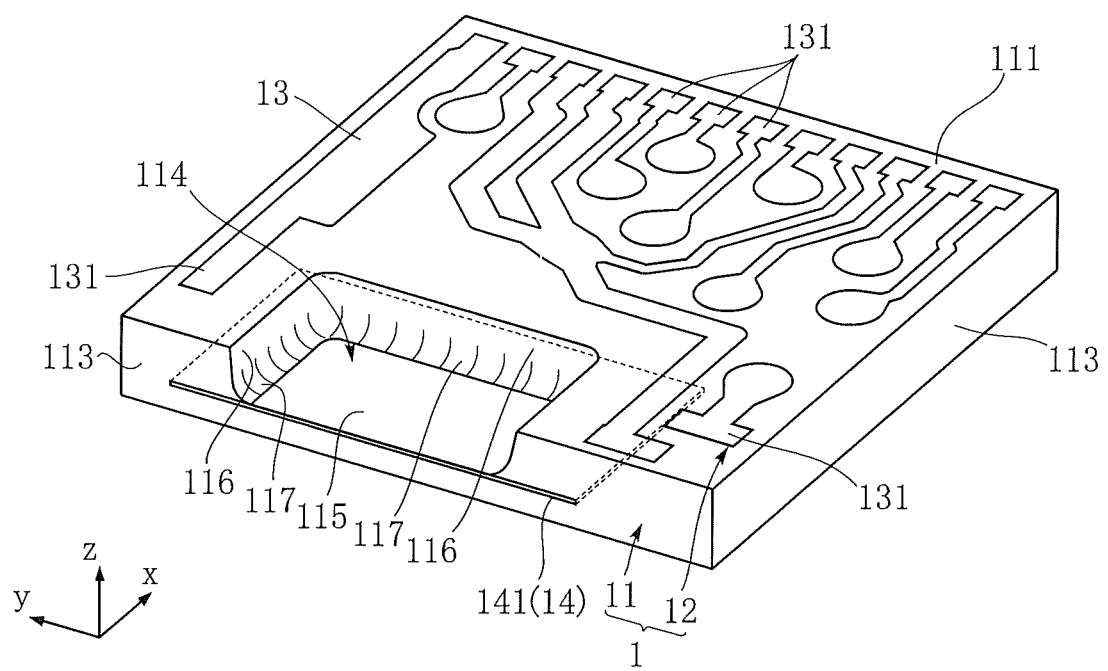
FIG. 8 is a perspective view showing a substrate that is used in the semiconductor device.

Each of the plurality of third wires 63 connects one pad 32 of the second direction sensor element 3 or one pad 42 of the third direction sensor element 4 to a pad 52 of the integrated circuit element 5, and is made of Au, for example. As shown in FIG. 5, a first bonding portion of the third wires 63 is connected to the pads 52 of the integrated circuit element 5. Also, a second bonding portion of the third wires 63 is connected to the pads 32 of the second direction sensor element 3 or the pads 42 of the third direction sensor element 4 via a bump.

The fourth wire 64 connects one pad 42 of the third direction sensor element 4 to one pad 131 of the substrate 1, and is made of Au, for example. As shown in FIG. 4, a first bonding portion of the fourth wire 64 is connected to the pad 131 of the substrate 1. Also, a second bonding portion of the fourth wire 64 is connected to the pad 42 of the third direction sensor element 4 via a bump.

Each of the plurality of fifth wires 65 connects one pad 52 of the integrated circuit element 5 to one pad 131 of the substrate 1, and is made of Au, for example. A first bonding portion of the fifth wires 65 is connected to the pads 52 of the integrated circuit element 5. Also, a second bonding portion of the fifth wires 65 is connected to the pads 131 of the substrate 1. There is no bump between the second bonding portion of the fifth wires 65 and the pads 131.

As shown in FIG. 2, a predetermined number of pads 131 are disposed so as to sandwich the recessed portion 114 in the y direction. The second wire 62 or the fifth wires 65 are bonded to these pads 131.

The resin sealing portion 7 covers the first direction sensor element 2, the second direction sensor element 3, the third direction sensor element 4, the integrated circuit element 5 and the first to fifth wires 61 to 65. Also, part of the resin sealing portion 7 fills the recessed portion 114. The resin sealing portion 7 is formed by, for example, an epoxy resin, a phenol resin, a polyimide resin, a p-phenylene benzobisoxazole (PBO) resin, or a silicone resin.

The resin sealing portion 7 has a lateral surface 71. The lateral surface 71 is parallel to the z direction. In the present embodiment, the lateral surface 71 consists of four flat surfaces. Also, in the present embodiment, the lateral surface 71 of the resin sealing portion 7 is flush with the lateral surface 113 of the substrate 1.

Next, the actions of the semiconductor device 101 and the substrate 1 will be described.

According to the present embodiment, part of first direction sensor element 2 is disposed within the recessed portion 114. Thereby, the distance from the main surface 111 of the substrate 1 to the upper end of the first direction sensor element 2 ("projected length" of the same sensor element) can be shortened, compared with the case where the recessed portion 114 is not provided. Therefore, miniaturization of the semiconductor device 101 can be attained.

The magnetic core 31 of the second direction sensor element 3 is parallel to the y direction, and the magnetic core 41 of the third direction sensor element 4 is parallel to the x direction. The second direction sensor element 3 and the third direction sensor element 4 are thus relatively small in the z direction. Accordingly, the second direction sensor element 3 and the third direction sensor element 4 do not impede miniaturization of the semiconductor device 101. Also, because the second direction sensor element 3 and the third direction sensor element 4 are installed on the integrated circuit element 5, these two elements will not increase the size of the semiconductor device 101 in the x and y directions.

By providing the blocking portion 141, the recessed portion 114 can be readily formed using the laser light L, as described with reference to FIG. 13. Also, because the laser light L is blocked by the blocking portion 141, the recessed portion 114 can be formed to a desired depth. The blocking portion 141 is larger than the bottom surface 115, thus enabling the laser light L to be reliably blocked by the blocking portion 141, even if there is a slight error in the irradiation accuracy of the laser light L.

As shown in FIG. 9, the recessed portion 114 is formed in only part of the substrate 1. Accordingly, the problem of the rigidity of the substrate 1 being unduly low due to the existence of the recessed portion 114 does not arise.

The second bonding portions of the first wires 61 are connected to the pads 52 of the integrated circuit element 5 via bumps. In a second bonding process in which a comparatively large force is exerted, the bumps function as shock-absorbing members. The same applies to the other bumps.

By providing the second bonding portions on the second direction sensor element 3 and third direction sensor element 4 side, it is possible to avoid unduly increasing the height (size in the z direction) of the semiconductor device 101.

FIGS. 14 to 25 show another embodiment of the present invention. Note that in these diagrams, the same reference signs are given to elements that are the same as or similar to the first embodiment.

Figure 14:
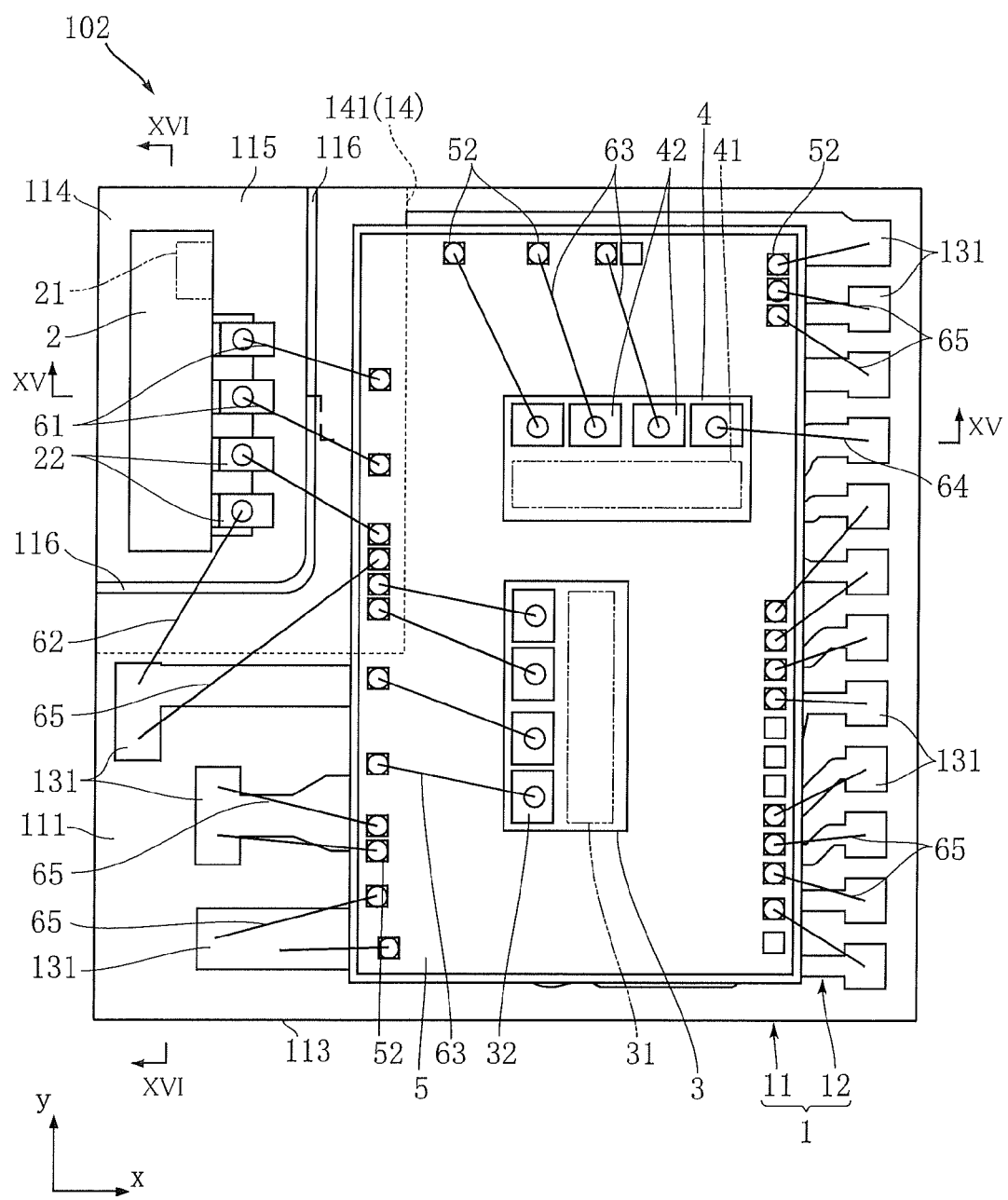
FIG. 14 is a plan view showing a semiconductor device that is based on a second embodiment of the present invention.
Figure 15:
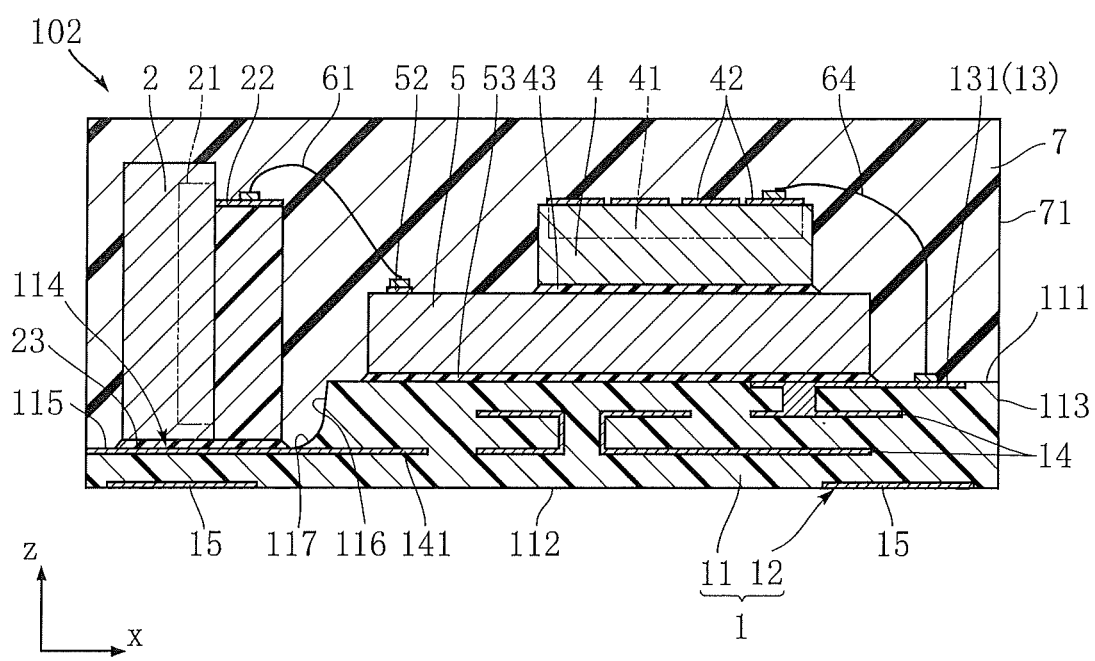
FIG. 15 is a cross-sectional view along an XV-XV line in FIG. 14.
Figure 16:
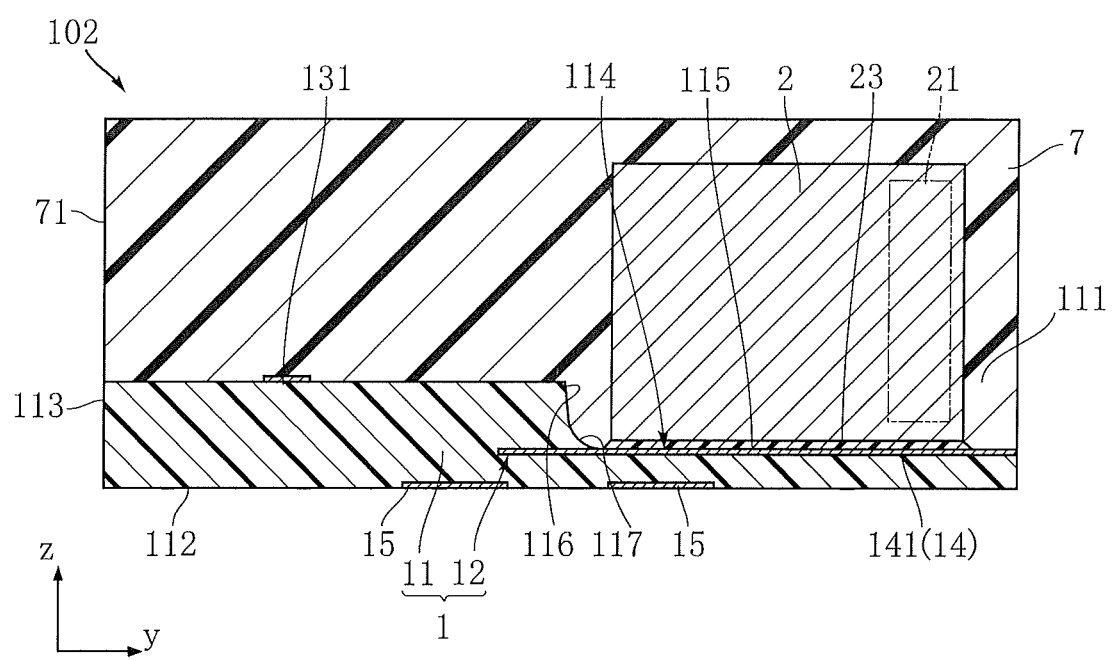
FIG. 16 is a cross-sectional view along an XVI-XVI line in FIG. 14.

FIGS. 14 to 16 show a semiconductor device that is based on a second embodiment of the present invention. A semiconductor device 102 of the present embodiment has a roughly similar configuration to the semiconductor device 101, except that the position at which the recessed portion 114 is formed differs from the substrate 1 of the semiconductor device 101 of the first embodiment.

Specifically, the semiconductor device 102 of the present embodiment is provided with a substrate 1, a first direction sensor element 2, a second direction sensor element 3, a third direction sensor element 4, an integrated circuit element 5, a plurality of first wires 61, a second wire 62, a plurality of third wires 63, a fourth wire 64, a plurality of fifth wires 65, and a resin sealing portion 7. The semiconductor device 102 is constituted so as to detect the orientation of the same semiconductor device in three-dimensional space utilizing geomagnetism. The detection result is output from the semiconductor device 102 as an electrical signal. In the present embodiment, the semiconductor device 102 is a rectangular parallelepiped, and has, for example, a size of about 2.0 mm in the x direction, about 2.0 mm and in the y direction, and about 0.8 mm in the z direction.

The substrate 1 supports the first direction sensor element 2, the second direction sensor element 3, the third direction sensor element 4, and the integrated circuit element 5. In the present embodiment, the substrate 1 is equipped with a base material 11 and a wiring pattern 12. The substrate 1 has a main surface 111, a back surface 112, a lateral surface 113, and a recessed portion 114. In the present embodiment, the substrate 1 is rectangular, and the lateral surface 113 consists of four flat surfaces. The substrate 1 has, for example, a size of about 2.0 mm in the x and y directions, and about 0.23 mm in the z direction.

The main surface 111 and the back surface 112 face in opposite directions to each other in the thickness direction (z direction) of the substrate 1. The lateral surface 113 is a surface connecting the main surface 111 and the back surface 112, and is parallel to the z direction in the present embodiment.

The recessed portion 114 is a portion recessed from the main surface 111 toward the back surface 112 side. In the present embodiment, the recessed portion 114, as shown in FIG. 14, is formed in the upper left corner of the substrate 1, and is open both to the left and upward. In other words, one opening that communicates with the recessed portion 114 is formed in both the left lateral surface and the upper lateral surface of the substrate 1. In the example shown in the diagram, the two openings are connected to each other, but may be configured to be mutually separated. The recessed portion 114 is approximately rectangular as viewed in the z direction, and has, for example, a size of about 0.5 mm in the x direction and about 1.0 mm in the y direction, and a depth of about 0.15 mm in the z direction.

Figure 17:
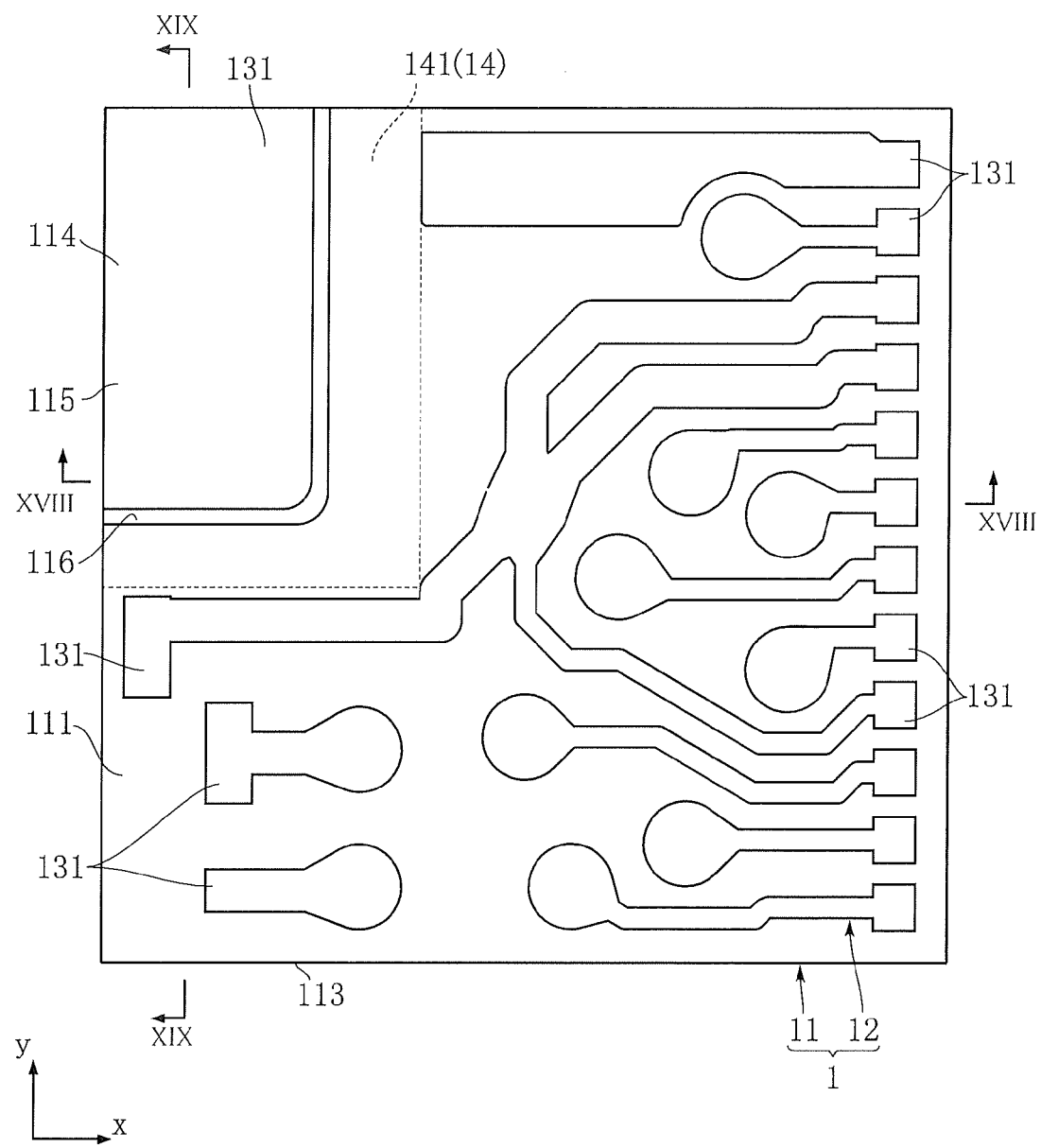
FIG. 17 is a plan view showing a substrate that is used in the semiconductor device of the second embodiment.
Figure 18:
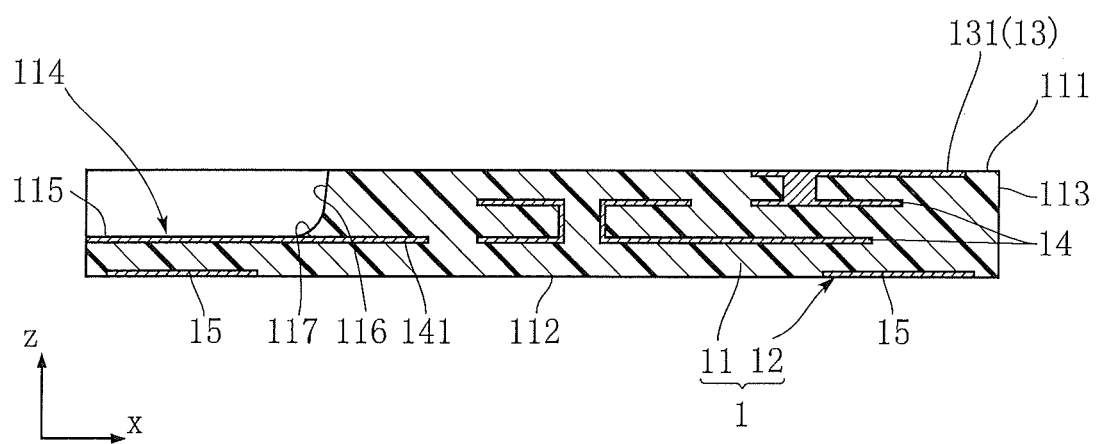
FIG. 18 is a cross-sectional view along an XVIII-XVIII line in FIG. 17.
Figure 19:
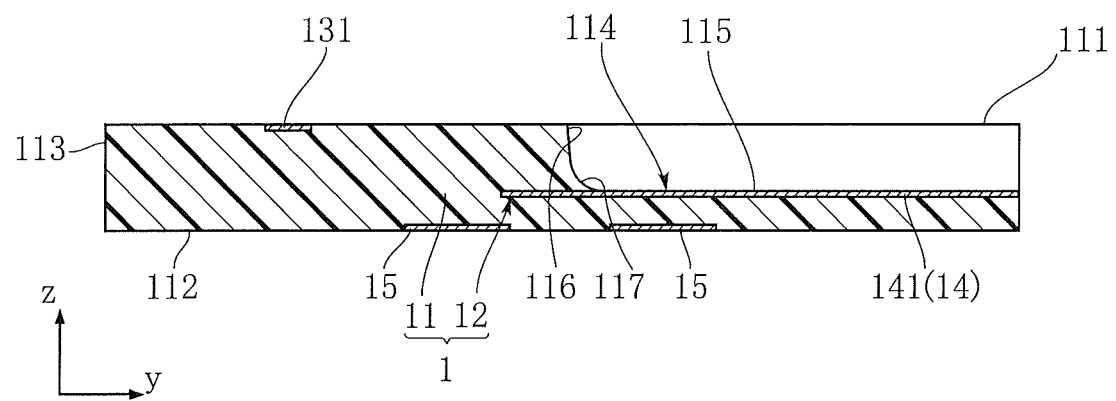
FIG. 19 is a cross-sectional view along an XIX-XIX line in FIG. 17.

FIGS. 17 to 19 show the substrate 1 that is used in the semiconductor device 102. As shown in these diagrams, the recessed portion 114 has a bottom surface 115, an inner surface 116, and a curved surface 117. The bottom surface 115 is located between the main surface 111 and the back surface 112 in the z direction, and faces upward in the z direction. In the present embodiment, the bottom surface 115 is a smooth surface. The inner surface 116 is connected to the main surface 111. In the present embodiment, the inner surface 116 has a shape consisting of two sides that intersect each other orthogonally, as viewed in the z direction (see FIG. 17). In the present embodiment, the inner surface 116 slopes in the z direction so as to become further distant from the center of the bottom surface 115 upwardly in the z direction. The curved surface 117 connects the inner surface 116 and the bottom surface 115, and curves concavely.

The base material 11 is made of an insulating material (e.g., glass epoxy resin). The wiring pattern 12 is made of a metal. The wiring pattern 12 may be a structure in which a plurality of layers made of different metals such as Cu, Ni and Au, for example, are laminated. The wiring pattern 12 has a main surface layer 13, a plurality of intermediate layers 14, and a plurality of back surface electrodes 15. In the present embodiment, the substrate 1 is a multilayer substrate including the base material 11, the main surface layer 13, the intermediate layers 14, and the back surface electrodes 15.

The main surface layer 13 is, as shown in FIG. 18, embedded in the base material 11, except for the upper surface. The upper surface of the main surface layer 13 is exposed to the outside at the main surface 111. The main surface layer 13 has a plurality of pads 131. Band-like portions forming conduction paths extend from the plurality of pads 131. As shown in FIG. 17, in the present embodiment, the plurality of pads 131 include pads disposed in proximity to the right side of the base material 11, and pads disposed in proximity to the upper side of the base material 11.

The intermediate layers 14 are layers provided inside the base material 11. In the present embodiment, there are two intermediate layers 14 (upper intermediate layer and lower intermediate layer) that are separated in the z direction. These intermediate layers 14 conduct to the main surface layer 13 and the plurality of back surface electrodes 15 as appropriate via through hole electrodes (or via electrodes). In the present embodiment, each through hole electrode extends through part of the base material 11 in the z direction.

The lower intermediate layers 14 has a blocking portion 141. The blocking portion 141 is larger than the recessed portion 114 as viewed in the z direction, and overlaps with the entire recessed portion 114. The bottom surface 115 of the recessed portion 114 is constituted by the upper surface of the blocking portion 141. In the present embodiment, the blocking portion 141 is rectangular. The blocking portion 141 is electrically insulated from other sites of the wiring pattern 12.

Each of the plurality of back surface electrodes 15 is embedded in the base material 11 such that the lower surface is exposed to the outside at the back surface 112. When the semiconductor device 102 is mounted on a circuit board, for example, the plurality of back surface electrodes 15 are used in order to establish electrical continuity with the circuit board. The disposition of the plurality of back surface electrodes 15 is similar to the disposition shown in FIG. 3. A configuration may be adopted in which at least one of the plurality of back surface electrodes 15 overlaps with the blocking portion 141 as viewed in the z direction (i.e., located below the blocking portion 141).

The substrate 1 of the present embodiment can be formed, for example, by the method mentioned above with reference to FIGS. 12 and 13.

The integrated circuit element 5 controls direction detection processing that uses the first direction sensor element 2, the second direction sensor element 3, and the third direction sensor element 4. In the present embodiment, the integrated circuit element 5 is constituted as a so-called ASIC (Application Specific Integrated Circuit) element, and the thickness thereof is about 80 to 100 μm.

The integrated circuit element 5 is joined to the main surface 111 by a joining material 53. The integrated circuit element 5 overlaps entirely with the main surface 111 as viewed in the z direction, and does not overlap with the recessed portion 114.

A plurality of pads 52 are formed on the upper surface of the integrated circuit element 5. In the present embodiment, the plurality of pads 52 are arrayed along three sides of the integrated circuit element 5 as viewed in the z direction. Each pad 52 has a surface made of Au, for example.

The first direction sensor element 2, the second direction sensor element 3 and the third direction sensor element 4 have detection reference axes in different directions to each other, and are used in order to detect the orientation of the semiconductor device 102 relative to geomagnetism. In the present embodiment, the first direction sensor element 2 has a magnetic core 21, the second direction sensor element 3 has a magnetic core 31, and the third direction sensor element 4 has a magnetic core 41. The magnetic core 21, the magnetic core 31 and the magnetic core 41 are metal rod-like members extending in predetermined directions. The longitudinal direction of each rod-like member is equivalent to the direction of the detection reference axis of the corresponding sensor element. Also, each sensor element has a coil (illustration omitted) formed so as to surround the magnetic core. The length (size measured in the longitudinal direction) of the axial center of each sensor element is about 0.6 mm, for example.

The first direction sensor element 2 is joined to the bottom surface 115 of the blocking portion 141 by a joining material 23. The first direction sensor element 2 is installed so as to be oriented with the magnetic core 21 parallel to the z direction. A lower portion of the first direction sensor element 2 thus overlaps with the recessed portion 114 in the z direction (i.e., is located within the recessed portion 114). An upper portion of the first direction sensor element 2 projects upward from the recessed portion 114. Four pads 22 are formed on the first direction sensor element 2. The four pads 22 are disposed slightly lower than the upper end of the first direction sensor element 2 (see FIG. 1). Each pad 22 faces upward, and has a surface made of Au, for example.

The second direction sensor element 3 is joined to the upper surface of the integrated circuit element 5 by a joining material 33. The magnetic core 31 of the second direction sensor element 3 is parallel to the y direction. The second direction sensor element 3 overlaps entirely with the integrated circuit element 5 as viewed in the z direction. Four pads 32 are formed on the second direction sensor element 3. The four pads 32 are disposed in a row in the y direction, and face upward in the z direction. Each pad 32 has a surface made of Au, for example.

The third direction sensor element 4 is joined to the upper surface of the integrated circuit element 5 by a joining material 43. The magnetic core 41 of the third direction sensor element 4 is parallel to the x direction. The third direction sensor element 4 overlaps entirely with the integrated circuit element 5 as viewed in the z direction. Four pads 42 are formed on the third direction sensor element 4. The four pads 42 are disposed in a row in the x direction, and face upward in the z direction. Each pad 42 has a surface made of Au, for example.

Each of the plurality of first wires 61 connects one pad 22 of the first direction sensor element 2 to one pad 52 of the integrated circuit element 5, and is made of Au, for example. As shown in FIG. 15, a first bonding portion of the first wires 61 is connected to the pads 22 of the first direction sensor element 2. Also, a second bonding portion of the first wires 61 is connected to the pads 52 of the integrated circuit element 5 via a bump. The bumps are formed by melting the tip of a wire made of Au, and adhering this molten ball to the pad 52.

The second wire 62 connects one pad 22 of the first direction sensor element 2 to one pad 131 of the substrate 1, and is made of Au, for example. A first bonding portion of the second wire 62 is connected to the pad 22 of the first direction sensor element 2. Also, a second bonding portion of the second wire 62 is connected directly to the pad 131 of the substrate 1. That is, there is no bump between the second bonding portion of the second wire 62 and the pad 131.

Each of the plurality of third wires 63 connects one pad 32 of the second direction sensor element 3 or one pad 42 of the third direction sensor element 4 to a pad 52 of the integrated circuit element 5, and is made of Au, for example. Similarly to the configuration shown in FIG. 5, a first bonding portion of the third wires 63 is connected to the pads 52 of the integrated circuit element 5. Also, a second bonding portion of the third wires 63 is connected to the pads 32 of the second direction sensor element 3 or the pad 42 of the third direction sensor element 4 via a bump.

The fourth wire 64 connects one pad 42 of the third direction sensor element 4 to one pad 131 of the substrate 1, and is made of Au, for example. As shown in FIG. 15, a first bonding portion of the fourth wire 64 is connected to the pad 131 of the substrate 1. Also, a second bonding portion of the fourth wire 64 is connected to the pad 42 of the third direction sensor element 4 via a bump.

Each of the plurality of fifth wires 65 connects one pad 52 of the integrated circuit element 5 to one pad 131 of the substrate 1, and is made of Au, for example. A first bonding portion of the fifth wires 65 is connected to the pads 52 of the integrated circuit element 5. Also, a second bonding portion of the fifth wires 65 is connected to the pads 131 of the substrate 1. There is no bump between the second bonding portion of the fifth wire 65 and the pad 131.

As shown in FIG. 14, a plurality of pad 131 (three in the example shown in the diagram) are formed on only one side (lower side in FIG. 14) of the recessed portion 114 in the y direction, and the second wire 62 or the fifth wires 65 are bonded to these pads 131.

The resin sealing portion 7 covers the first direction sensor element 2, the second direction sensor element 3, the third direction sensor element 4, the integrated circuit element 5 and the first to fifth wires 61 to 65. Also, part of the resin sealing portion 7 fills the recessed portion 114. The resin sealing portion 7 is formed by, for example, an epoxy resin, a phenol resin, a polyimide resin, a p-phenylene benzobisoxazole (PBO) resin, or a silicone resin.

The resin sealing portion 7 has a lateral surface 71. The lateral surface 71 is parallel to the z direction. In the present embodiment, the lateral surface 71 consists of four flat surfaces. Also, in the present embodiment, the lateral surface 71 of the resin sealing portion 7 is flush with the lateral surface 113 of the substrate 1.

Miniaturization of the semiconductor device can also be attained according to the second embodiment.

Figure 20:
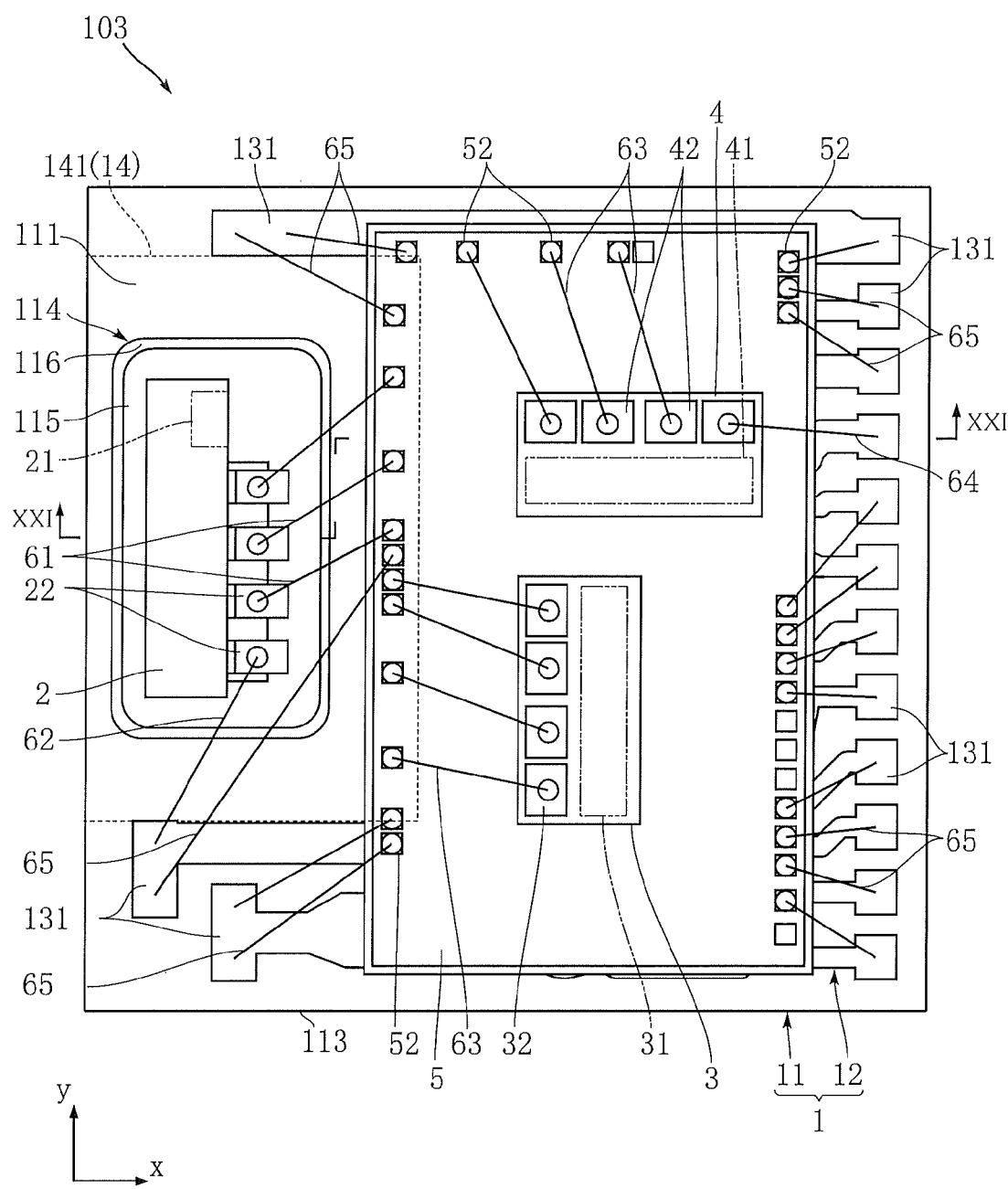
FIG. 20 is a plan view showing a semiconductor device that is based on a third embodiment of the present invention.
Figure 21:
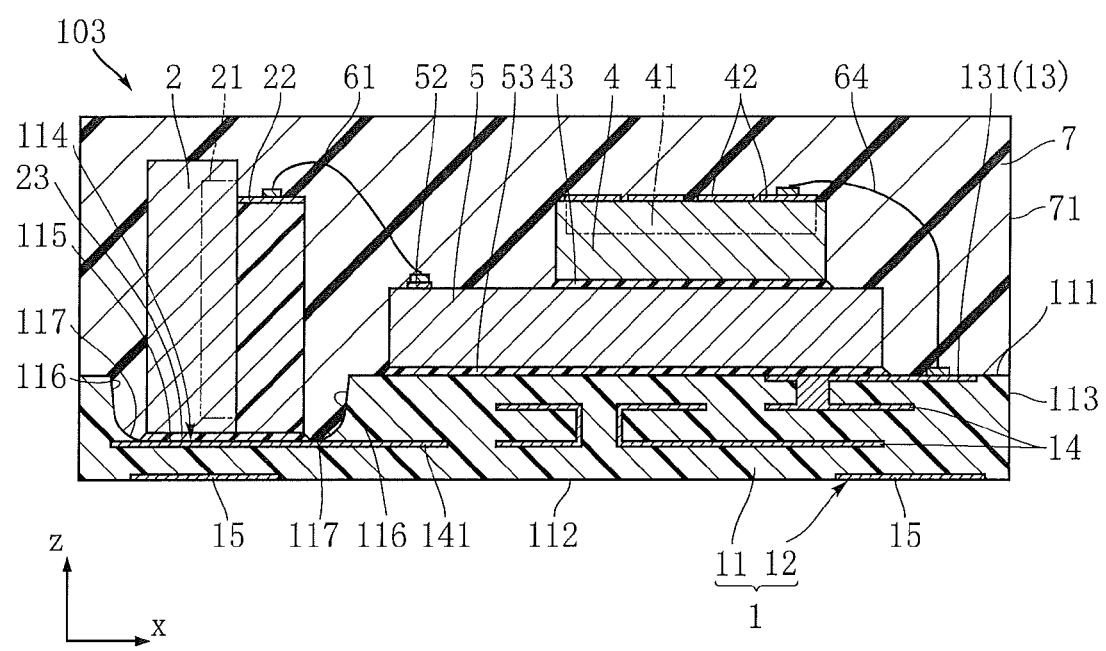
FIG. 21 is a cross-sectional view along an XXI-XXI line in FIG. 20.

FIGS. 20 and 21 show a semiconductor device 103 that is based on a third embodiment of the present invention. The semiconductor device 103 of the present embodiment is provided with a substrate 1, a first direction sensor element 2, a second direction sensor element 3, a third direction sensor element 4, an integrated circuit element 5, a plurality of first wires 61, a second wire 62, a plurality of third wires 63, a fourth wire 64, a plurality of fifth wires 65, and a resin sealing portion 7. The semiconductor device 103 is constituted so as to detect the orientation of the same semiconductor device in three-dimensional space utilizing geomagnetism. The detection result is output from the semiconductor device 103 as an electrical signal. In the present embodiment, the semiconductor device 103 is a rectangular parallelepiped, and has, for example, a size of about 2.0 mm in the x direction, about 2.0 mm and in the y direction, and about 0.8 mm in the z direction.

FIG. 20 is a plan view showing the semiconductor device 103. FIG. 21 is a cross-sectional view along an XXI to XXI line in FIG. 20. The resin sealing portion 7 is omitted in FIG. 20.

The substrate 1 supports the first direction sensor element 2, the second direction sensor element 3, the third direction sensor element 4, and the integrated circuit element 5. In the present embodiment, the substrate 1 is equipped with a base material 11 and a wiring pattern 12. The substrate 1 has a main surface 111, a back surface 112, a lateral surface 113, and a recessed portion 114. In the present embodiment, the substrate 1 is rectangular, and the lateral surface 113 consists of four flat surfaces. The substrate 1 has, for example, a size of about 2.0 mm in the x and y directions, and about 0.23 mm in the z direction.

The main surface 111 and the back surface 112 face in opposite directions to each other in the thickness direction (z direction) of the substrate 1. The lateral surface 113 is a surface connecting the main surface 111 and the back surface 112, and is parallel to the z direction in the present embodiment.

The recessed portion 114 is a portion recessed from the main surface 111 toward the back surface 112 side. As shown in FIG. 20, the recessed portion 114 is formed at a position in proximity to the left edge of the substrate 1 and separated from the left edge, and the periphery thereof is completely surrounded by the main surface 111. That is, the recessed portion 114 is disposed away from all of the lateral surfaces of the substrate 1, and is open only upward (z direction). The recessed portion 114 is approximately rectangular as viewed in the z direction, and has, for example, a size of about 0.5 mm in the x direction and about 1.0 mm in the y direction, and a depth of about 0.15 mm in the z direction.

Figure 22:
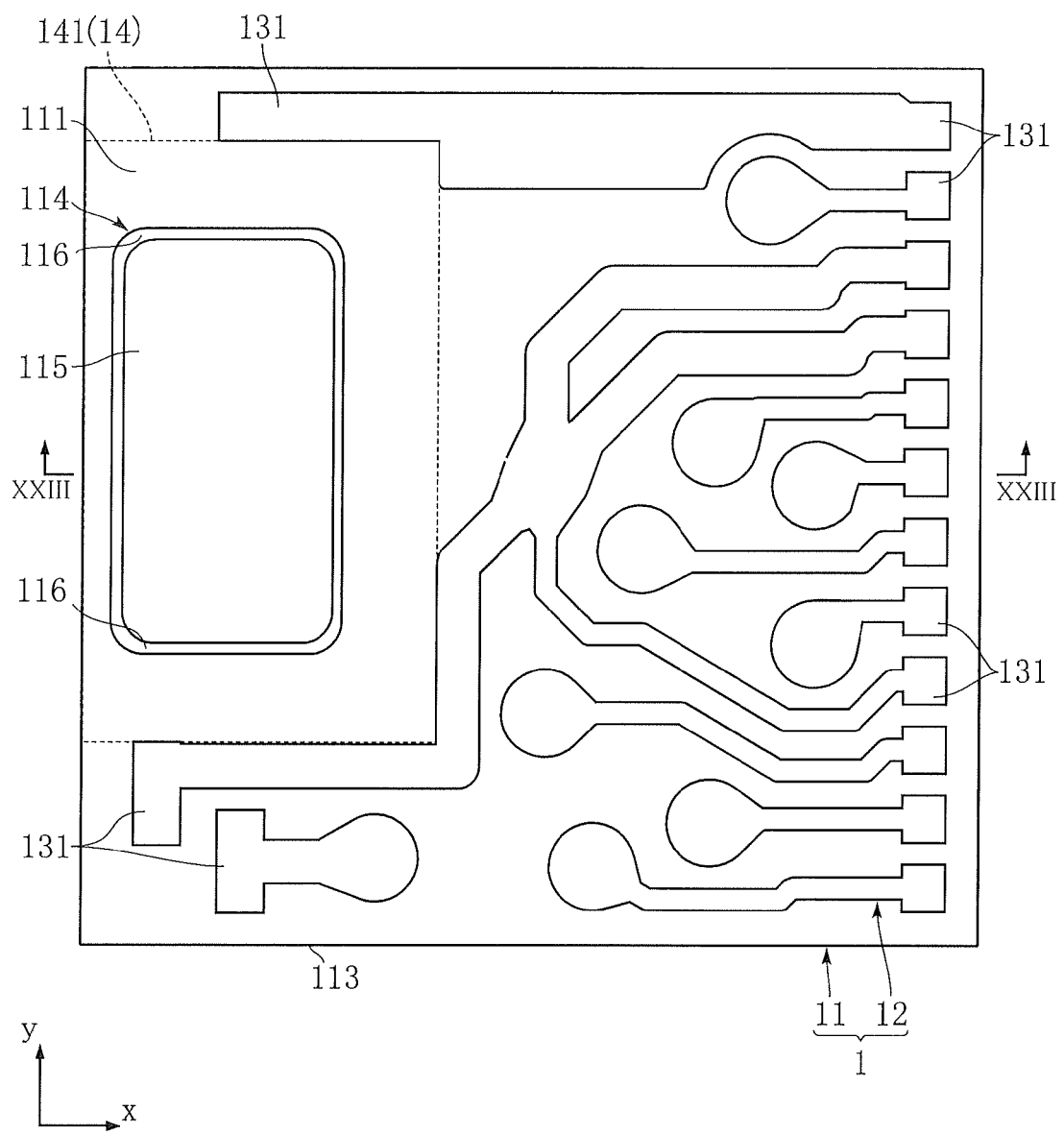
FIG. 22 is a plan view showing a substrate that is used in the semiconductor device of the third embodiment.
Figure 23:
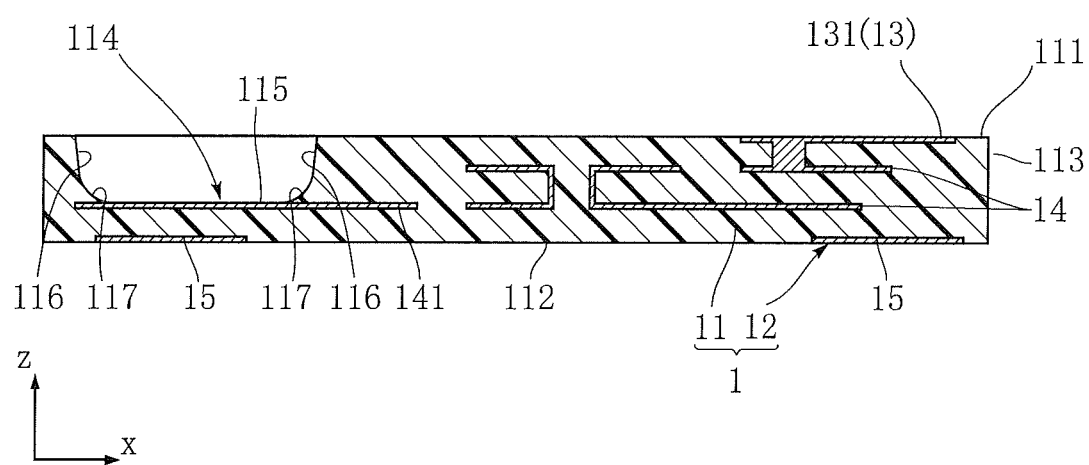
FIG. 23 is a cross-sectional view along an XXIII-XXIII line in FIG. 22.

FIGS. 22 and 23 show the substrate 1 that is used in the semiconductor device 103. As shown in these diagrams, the recessed portion 114 has a bottom surface 115, an inner surface 116, and a curved surface 117. The bottom surface 115 is located between the main surface 111 and the back surface 112 in the z direction, and faces upward in the z direction. In the present embodiment, the bottom surface 115 is a smooth surface. The inner surface 116 is connected to the main surface 111. In the present embodiment, the inner surface 116 is rectangular as viewed in the z direction. In the present embodiment, the inner surface 116 slopes in the z direction so as to become further distant from the center of the bottom surface 115 upwardly in the z direction. The curved surface 117 connects the inner surface 116 and the bottom surface 115, and curves concavely.

The base material 11 is made of an insulating material (e.g., glass epoxy resin). The wiring pattern 12 is made of a metal. The wiring pattern 12 may be a structure in which a plurality of layers made of different metals such as Cu, Ni and Au, for example, are laminated. The wiring pattern 12 has a main surface layer 13, a plurality of intermediate layers 14, and a plurality of back surface electrodes 15. In the present embodiment, the substrate 1 is a multilayer substrate including the base material 11, the main surface layer 13, the intermediate layers 14, and the back surface electrodes 15.

The main surface layer 13 is, as shown in FIG. 20, embedded in the base material 11, except for the upper surface. The upper surface of the main surface layer 13 is exposed to the outside at the main surface 111. The main surface layer 13 has a plurality of pads 131. Band-like portions forming conduction paths extend from the plurality of pads 131. As shown in FIG. 9, in the present embodiment, the plurality of pads 131 include pads disposed in proximity to the right side of the base material 11, pads disposed in proximity to the top left corner of the base material 11, and pads disposed in proximity to the bottom left corner of the base material 11.

The intermediate layers 14 are layers provided inside the base material 11. In the present embodiment, there are two intermediate layers 14 (upper intermediate layer and lower intermediate layer) that are separated in the z direction. These intermediate layers 14 conduct to the main surface layer 13 and the plurality of back surface electrodes 15 as appropriate via through hole electrodes (or via electrodes). In the present embodiment, each through hole electrode extends through part of the base material 11 in the z direction.

The lower intermediate layers 14 has a blocking portion 141. The blocking portion 141 is larger than the recessed portion 114 as viewed in the z direction, and overlaps with the entire recessed portion 114. The bottom surface 115 of the recessed portion 114 is constituted by the upper surface of the blocking portion 141. In the present embodiment, the blocking portion 141 is rectangular. The blocking portion 141 is electrically insulated from other regions of the wiring pattern 12.

Each of the plurality of back surface electrodes 15 is embedded in the base material 11 such that the lower surface is exposed to the outside at the back surface 112. When the semiconductor device 103 is mounted on a circuit board, for example, the plurality of back surface electrodes 15 are used in order to establish electrical continuity with the circuit board. The disposition of the plurality of back surface electrodes 15 is similar to the disposition shown in FIG. 3. Similarly to the semiconductor device of the first embodiment, two back surface electrodes 15 overlap with the blocking portion 141 of the wiring pattern 12 as viewed in the z direction, and are located below the blocking portion 141.

The substrate 1 of the present embodiment can be formed, for example, by the method mentioned above with reference to FIGS. 12 and 13.

The integrated circuit element 5 is for controlling direction detection processing that uses the first direction sensor element 2, the second direction sensor element 3, and the third direction sensor element 4. In the present embodiment, the integrated circuit element 5 is constituted as a so-called ASIC (Application Specific Integrated Circuit) element, and the thickness thereof is about 80 to 100 µm.

The integrated circuit element 5 is joined to the main surface 111 by a joining material 53. The integrated circuit element 5 overlaps entirely with the main surface 111 as viewed in the z direction, and does not overlap with the recessed portion 114.

A plurality of pads 52 are formed on the upper surface of the integrated circuit element 5. In the present embodiment, the plurality of pads 52 are arrayed along three sides of the integrated circuit element 5 as viewed in the z direction. Each pad 52 has a surface made of Au, for example.

The first direction sensor element 2, the second direction sensor element 3 and the third direction sensor element 4 have detection reference axes in different directions to each other, and are used in order to detect the orientation of the semiconductor device 103 relative to geomagnetism. In the present embodiment, the first direction sensor element 2 has a magnetic core 21, the second direction sensor element 3 has a magnetic core 31, and the third direction sensor element 4 has a magnetic core 41. The magnetic core 21, the magnetic core 31 and the magnetic core 41 are metal rod-like members extending in predetermined directions. The longitudinal direction of each rod-like member is equivalent to the direction of the detection reference axis of the corresponding sensor element. Also, each sensor element has a coil (illustration omitted) formed so as to surround the magnetic core. The length (size measured in the longitudinal direction) of the axial center of each sensor element is about 0.6 mm, for example.

The first direction sensor element 2 is joined to the bottom surface 115 of the blocking portion 141 by a joining material 23. The first direction sensor element 2 is installed so as to be oriented with the magnetic core 21 parallel to the z direction. A lower portion of the first direction sensor element 2 thus overlaps with the recessed portion 114 in the z direction (i.e., is located within the recessed portion 114). An upper portion of the first direction sensor element 2 projects upward from the recessed portion 114. Four pads 22 are formed on the first direction sensor element 2. The four pads 22 are disposed slightly lower than the upper end of the first direction sensor element 2 (see FIG. 1). Each pad 22 faces upward, and has a surface made of Au, for example.

The second direction sensor element 3 is joined to the upper surface of the integrated circuit element 5 by a joining material 33. The magnetic core 31 of the second direction sensor element 3 is parallel to the y direction. The second direction sensor element 3 overlaps entirely with the integrated circuit element 5 as viewed in the z direction. Four pads 32 are formed on the second direction sensor element 3. The four pads 32 are disposed in a row in the y direction, and face upward in the z direction. Each pad 32 has a surface made of Au, for example.

The third direction sensor element 4 is joined to the upper surface of the integrated circuit element 5 by a joining material 43. The magnetic core 41 of the third direction sensor element 4 is parallel to the x direction. The third direction sensor element 4 overlaps entirely with the integrated circuit element 5 as viewed in the z direction. Four pads 42 are formed on the third direction sensor element 4. The four pads 42 are disposed in a row in the x direction, and face upward in the z direction. Each pad 42 has a surface made of Au, for example.

Each of the plurality of first wires 61 connects one pad 22 of the first direction sensor element 2 to one pad 52 of the integrated circuit element 5, and is made of Au, for example. As shown in FIG. 21, a first bonding portion of the first wires 61 is connected to the pads 22 of the first direction sensor element 2. Also, a second bonding portion of the first wires 61 is connected to the pads 52 of the integrated circuit element 5 via a bump. The bumps are formed by melting the tip of a wire made of Au, and adhering this molten ball to the pad 52.

The second wire 62 connects one pad 22 of the first direction sensor element 2 to one pad 131 of the substrate 1, and is made of Au, for example. A first bonding portion of the second wire 62 is connected to the pad 22 of the first direction sensor element 2. Also, a second bonding portion of the second wire 62 is connected directly to the pad 131 of the substrate 1. That is, there is no bump between the second bonding portion of the second wire 62 and the pad 131.

Each of the plurality of third wires 63 connects one pad 32 of the second direction sensor element 3 or one pad 42 of the third direction sensor element 4 to a pad 52 of the integrated circuit element 5, and is made of Au, for example. Similarly to the configuration shown in FIG. 5, a first bonding portion of the third wires 63 is connected to the pads 52 of the integrated circuit element 5. Also, a second bonding portion of the third wires 63 is connected to the pads 32 of the second direction sensor element 3 or the pad 42 of the third direction sensor element 4 via a bump.

The fourth wire 64 connects one pad 42 of the third direction sensor element 4 to one pad 131 of the substrate 1, and is made of Au, for example. As shown in FIG. 21, a first bonding portion of the fourth wire 64 is connected to the pad 131 of the substrate 1. Also, a second bonding portion of the fourth wire 64 is connected to the pad 42 of the third direction sensor element 4 via a bump.

Each of the plurality of fifth wires 65 connects one pad 52 of the integrated circuit element 5 to one pad 131 of the substrate 1, and is made of Au, for example. A first bonding portion of the fifth wires 65 is connected to the pads 52 of the integrated circuit element 5. Also, a second bonding portion of the fifth wires 65 is connected to the pads 131 of the substrate 1. There is no bump between the second bonding portion of the fifth wire 65 and the pad 131.

As shown in FIG. 20, a predetermined number of pads 131 are disposed so as to sandwich the recessed portion 114 in the y direction. The second wire 62 or the fifth wires 65 are bonded to these pads 131.

The resin sealing portion 7 covers the first direction sensor element 2, the second direction sensor element 3, the third direction sensor element 4, the integrated circuit element 5 and the first to fifth wires 61 to 65. Also, part of the resin sealing portion 7 fills the recessed portion 114. The resin sealing portion 7 is formed by, for example, an epoxy resin, a phenol resin, a polyimide resin, a p-phenylene benzobisoxazole (PBO) resin, or a silicone resin.

The resin sealing portion 7 has a lateral surface 71. The lateral surface 71 is parallel to the z direction. In the present embodiment, the lateral surface 71 consists of four flat surfaces. Also, in the present embodiment, the lateral surface 71 of the resin sealing portion 7 is flush with the lateral surface 113 of the substrate 1.

Miniaturization of the semiconductor device can also be attained according to the third embodiment. Also, because the entire periphery of the recessed portion 114 is surrounded by the main surface 111, the substrate 1 will have a relatively high rigidity, and the substrate 1 can be made relatively thin.

Figure 24:
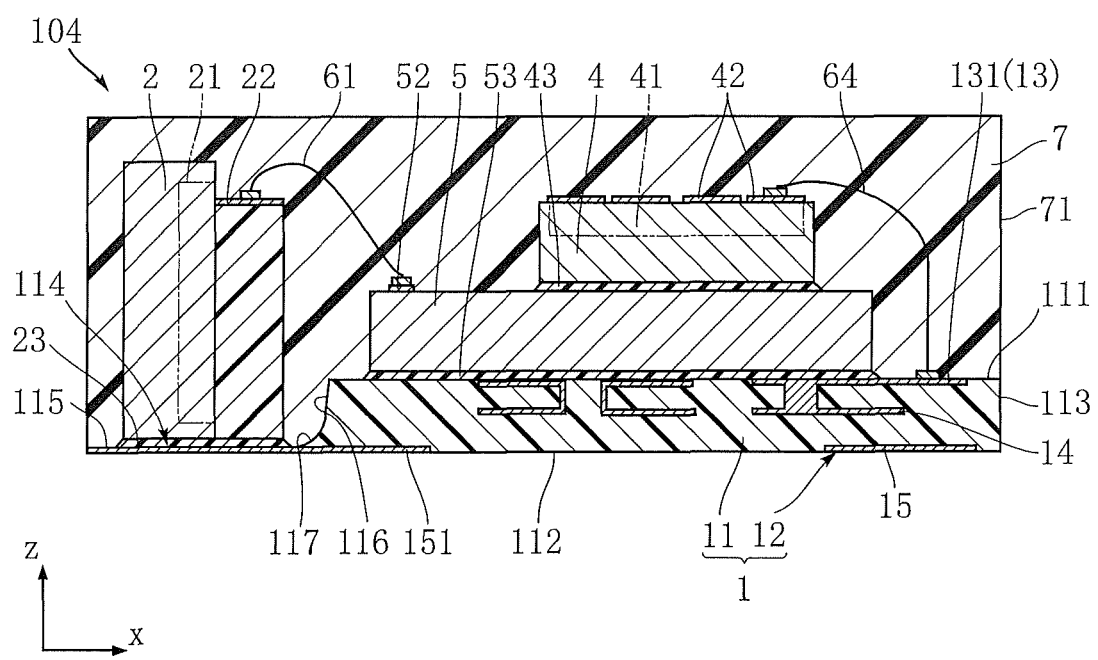
FIG. 24 is a cross-sectional view showing a semiconductor device that is based on a fourth embodiment of the present invention.

FIG. 24 shows a semiconductor device 104 that is based on a fourth embodiment of the present invention. The semiconductor device 104 has a similar configuration as the semiconductor device 101 of the first embodiment, apart from the configuration of the substrate 1 differing.

In the present embodiment, the wiring pattern 12 has a blocking portion 151, instead of the abovementioned blocking portion 141. The blocking portion 151, like the plurality of back surface electrodes 15, has a back surface exposed at a back surface 112 of a base material 11. The upper surface of the blocking portion 151 constitutes a bottom surface 115 of a recessed portion 114, similarly to the first embodiment.

As above mentioned, the lower surface of the blocking portion 151 is exposed to the outside. That is, in the present embodiment, the base material 11 does not have a portion that is located below the blocking portion 151. An insulating layer (resist layer) may be formed on the lower surface of the blocking portion 151 if necessary. It is thereby possible, for example, to prevent the blocking portion 151 unduly conducting with the circuit board on which the semiconductor device 104 is mounted.

Figure 25:
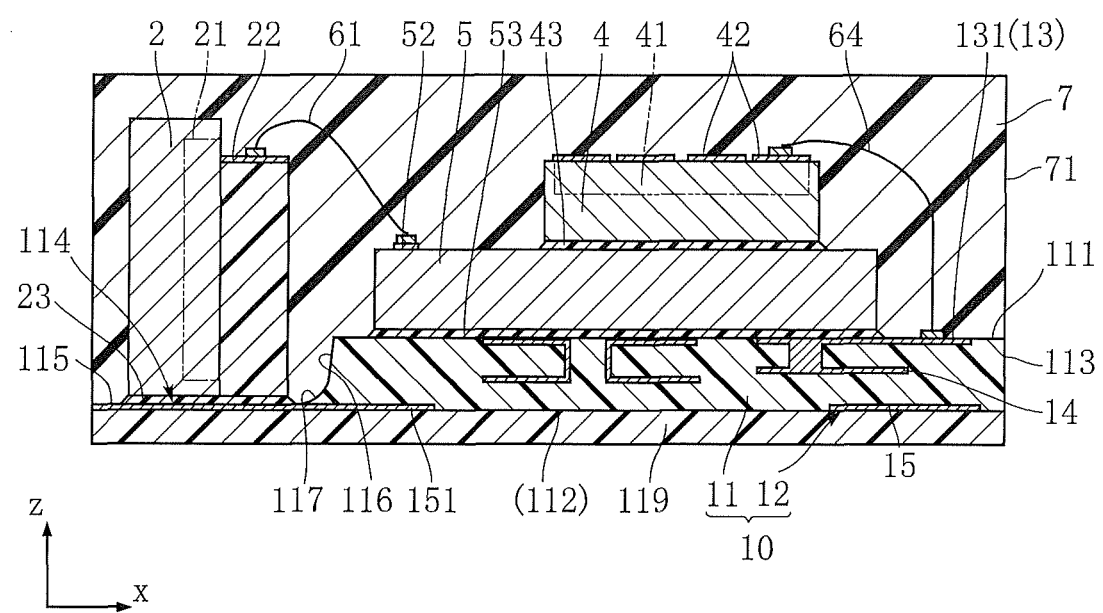
FIG. 25 is a cross-sectional view showing a method for manufacturing the semiconductor device of the fourth embodiment.

FIG. 25 shows one process in the method for manufacturing the semiconductor device 104. The diagram shows a state in which formation of the resin sealing portion 7 has been completed. For ease of understanding, prior to formation of the resin sealing portion 7, the first direction sensor element 2, the second direction sensor element 3, the third direction sensor element 4 and the integrated circuit element 5 are installed on the substrate material 10, and thereafter bonding of the first to fifth wires 61 to 65 is performed. Note that the diagram shows only a portion that is required in order to manufacture one semiconductor device 104. According to the present invention, a plurality of semiconductor devices 104 may be manufactured collectively, by using a substrate material 10 having a predetermined size.

The substrate material 10 of the present embodiment includes an auxiliary portion 119 that is removed later. In the present embodiment, the auxiliary portion 119 is provided under the base material 11. The auxiliary portion 119 covers the blocking portion 151 and the plurality of back surface electrodes 15 from below. The auxiliary portion 119 may be integrally formed using the same material as the base material 11. Alternatively, a different material from the base material 11 may be used. Alternatively, the auxiliary portion 119 may be constituted as a separate sheet to the base material 11, and the sheet may be adhered to the base material 11.

The auxiliary portion 119 is provided in a process before formation of the resin sealing portion 7 is completed. The rigidity of the substrate material 10 can thereby be maintained at a desired level. After the resin sealing portion 7 is formed, the auxiliary portion 119 is removed, exposing the blocking portion 151 and the plurality of back surface electrodes 15. Removal of the auxiliary portion 119 can be performed with various methods. For example, in the case where the auxiliary portion 119 and the base material are formed integrally using the same material, the auxiliary portion 119 can be removed by polishing. In the case where the auxiliary portion 119 is formed using a different material from the base material 11, chemical techniques such as etching in which only the auxiliary portion 119 is dissolved can be used. In the case where the auxiliary portion 119 is a sheet adhered to the base material 11, removal of the auxiliary portion 119 can be performed by exfoliating the sheet from the base material 11.

According to the fourth embodiment, it is possible to further reduce the size of the semiconductor device in the z direction, compared with the first to third embodiments.

The semiconductor device according to the present invention is not limited to the abovementioned embodiments. Design modifications can be variously made to the specific configurations of the constituent elements of a semiconductor device according to the present invention.

Configurations according to the embodiments of the present invention and variations thereof will be described below as appendixes.

(Appendix 1)
A substrate has a main surface and a back surface that face in opposite directions to each other in a thickness direction, and a recessed portion that is recessed from the main surface toward the back surface side.

(Appendix 2)
In the substrate according to Appendix 1, the recessed portion has a bottom surface that is located between the main surface and the back surface in the thickness direction.

(Appendix 3)
In the substrate according to Appendix 2, the recessed portion has an inner surface that is connected to the main surface.

(Appendix 4)
In the substrate according to Appendix 3, the inner surface slopes in the thickness direction.

(Appendix 5)
In the substrate according to Appendix 4, the recessed portion has a curved surface connecting the bottom surface and the inner surface.

(Appendix 6)
In the substrate according to Appendix 2, the substrate includes a base material that constitutes the main surface and the back surface and that has a wiring pattern formed therein.

(Appendix 7)
In the substrate according to Appendix 6, the wiring pattern has an intermediate layer that is located between the main surface and the back surface in the thickness direction, and the intermediate layer includes a blocking portion that constitutes a bottom surface of the recessed portion.

(Appendix 8)
In the substrate according to Appendix 7, the blocking portion is larger than the bottom surface as viewed in the thickness direction.

(Appendix 9)
In the substrate according to Appendix 8, the base material has a portion that is located between the intermediate layer and the back surface.

(Appendix 10)
In the substrate according to Appendix 9, the wiring pattern has a plurality of back surface electrodes that are exposed at the back surface.

(Appendix 11)
In the substrate according to Appendix 10, at least one of the plurality of back surface electrodes overlaps with the blocking portion as viewed in the thickness direction.

(Appendix 12)
In the substrate according to Appendix 10, the blocking portion and the plurality of back surface electrodes are insulated from each other.

(Appendix 13)
In the substrate according to Appendix 1, the substrate has one lateral surface having formed therein an opening that communicates with the recessed portion.

(Appendix 14)
In the substrate according to Appendix 1, the substrate has two lateral surfaces each having formed therein an opening that communicates with the recessed portion.

(Appendix 15)
In the substrate according to Appendix 1, the recessed portion is separated from all lateral surfaces of the substrate.

(Appendix 16)
In the substrate according to Appendix 7, the blocking portion is exposed at the back surface.

(Appendix 17)
In the substrate according to Appendix 1, the substrate is used in manufacturing a semiconductor device that includes an integrated circuit element and three direction sensor elements having different detection reference axes from each other.

(Appendix 18)
In the substrate according to Appendix 17, the recessed portion is used in order to accommodate at least one of the three direction sensor elements.

(Appendix 19)
A method for manufacturing a substrate includes a process of preparing a substrate material that is provided with a base material having a main surface and a back surface that face in opposite directions to each other in a thickness direction and a wiring pattern including a blocking portion that is located between the main surface and the back surface, and a process of forming a recessed portion that is recessed from the main surface toward the back surface side, by removing part of the base material that overlaps with the blocking portion as viewed in the thickness direction.

(Appendix 20)
In the method for manufacturing a substrate according to Appendix 19, the portion of the base material is removed by a laser in the process of forming the recessed portion.

(Appendix 21)
In the method for manufacturing a substrate according to Appendix 20, the wiring pattern has another portion insulated from the blocking portion.

The invention claimed is:

1. A semiconductor device comprising:
a substrate including a main surface and a back surface that face in opposite directions to each other in a thickness direction; and
first, second and third direction sensor elements having different detection reference axes from each other;
wherein the substrate is formed with a recessed portion that is recessed from the main surface toward the back surface,
the first direction sensor element is disposed at least partially within the recessed portion, and the second direction sensor element is disposed so as to overlap with the main surface as viewed in the thickness direction.

2. The semiconductor device according to claim 1, wherein the third direction sensor element is disposed so as to overlap with the main surface as viewed in the thickness direction.

3. The semiconductor device according to claim 2, wherein the detection reference axis of the first direction sensor element extends in the thickness direction.

4. The semiconductor device according to claim 2, wherein the detection reference axis of the second direction sensor element is parallel to the main surface.

5. The semiconductor device according to claim 2, wherein the detection reference axis of the third direction sensor element is parallel to the main surface.

6. The semiconductor device according to claim 2, wherein the detection reference axes of the first, second and third direction sensor elements are at right angles to each other.

7. The semiconductor device according to claim 2, further comprising an integrated circuit element that is interposed between the main surface and the second direction sensor element.

8. The semiconductor device according to claim 7, wherein part of the first direction sensor element projects from the main surface of the substrate in the thickness direction.

9. The semiconductor device according to claim 8, wherein the recessed portion has a bottom surface that is located between the main surface and the back surface in the thickness direction, and the first direction sensor element is supported by the bottom surface.

10. The semiconductor device according to claim 9, wherein the recessed portion includes an inner surface that is connected to the main surface.

11. The semiconductor device according to claim 10, wherein the inner surface slopes in the thickness direction.

12. The semiconductor device according to claim 11, wherein the recessed portion includes a curved surface connecting the bottom surface and the inner surface.

13. The semiconductor device according to claim 9, wherein the substrate includes a base material that constitutes the main surface and the back surface, the base material being provided with a wiring pattern.

14. The semiconductor device according to claim 13, wherein the wiring pattern includes an intermediate layer that is located between the main surface and the back surface in the thickness direction, and the intermediate layer includes a blocking portion that constitutes the bottom surface of the recessed portion.

15. The semiconductor device according to claim 14, wherein the blocking portion is larger than the bottom surface as viewed in the thickness direction.

16. The semiconductor device according to claim 15, wherein the base material includes a portion that is located between the intermediate layer and the back surface.

17. The semiconductor device according to claim 16, wherein the wiring pattern includes a plurality of back surface electrodes that are exposed at the back surface.

18. The semiconductor device according to claim 17, wherein at least one of the plurality of back surface electrodes overlaps with the blocking portion as viewed in the thickness direction.

19. The semiconductor device according to claim 17, wherein the blocking portion and the plurality of back surface electrodes are insulated from each other.

20. The semiconductor device according to claim 1, wherein the substrate includes one lateral surface having formed therein an opening that communicates with the recessed portion.

21. The semiconductor device according to claim 1, wherein the substrate includes two lateral surfaces each having formed therein an opening that communicates with the recessed portion.

22. The semiconductor device according to claim 1, wherein the recessed portion is separated from all lateral surfaces of the substrate.

23. The semiconductor device according to claim 13, wherein the blocking portion is exposed at the back surface.

24. The semiconductor device according to claim 23, wherein the first direction sensor element, the second direction sensor element, the third direction sensor element and the integrated circuit element each have a plurality of pads, and
the wiring pattern includes a plurality of pads that are exposed at the main surface.

25. The semiconductor device according to claim 24, further comprising: a wire including a first bonding portion and a second bonding portion; and a bump;
wherein the first bonding portion is connected to one pad of the first direction sensor element, and the second bonding portion is connected to one pad of the integrated circuit element via the bump.

26. The semiconductor device according to claim 24, further comprising a wire including a first bonding portion and a second bonding portion,
wherein the first bonding portion is connected to one pad of the first direction sensor element, and the second bonding portion is connected to one pad of the wiring pattern.

27. The semiconductor device according to claim 24, further comprising: a wire including a first bonding portion and a second bonding portion; and a bump;
wherein the first bonding portion is connected to one pad of the integrated circuit element, and the second bonding portion is connected to one pad of one of the second direction sensor element and the third direction sensor element via the bump.

28. The semiconductor device according to claim 24, further comprising a wire including a first bonding portion and a second bonding portion,
wherein the first bonding portion is connected to one pad of the integrated circuit element, and the second bonding portion is connected to one pad of the wiring pattern.

29. The semiconductor device according to claim 28, further comprising: an additional wire including a first bonding portion and a second bonding portion; and a bump;
wherein the first bonding portion of the additional wire is connected to one pad of the wiring pattern, and the second bonding portion of the additional wire is connected to one pad of the integrated circuit element via the bump.

30. The semiconductor device according to claim 1, further comprising a resin sealing portion that covers the first direction sensor element, the second direction sensor element and the third direction sensor element, wherein part of the resin sealing portion fills the recessed portion.

31. The semiconductor device according to claim 30, wherein the substrate includes a lateral surface connecting the main surface and the back surface, and the resin sealing portion includes a lateral surface that is flush with the lateral surface of the substrate.

\* \* \* \* \*